(12) United States Patent
Nagashima et al.

(10) Patent No.: US 9,860,991 B2
(45) Date of Patent: Jan. 2, 2018

(54) LIGHTING APPARATUS

(71) Applicant: Rohm Co., Ltd., Kyoto (JP)

(72) Inventors: Mitsunori Nagashima, Kyoto (JP); Masahide Tanaka, Osaka (JP)

(73) Assignee: Rohm Co., Ltd., Kyoto (JP)

( * ) Notice: Subject to any disclaimer, the term of this patent is extended or adjusted under 35 U.S.C. 154(b) by 289 days.

(21) Appl. No.: 14/702,921

(22) Filed: May 4, 2015

(65) Prior Publication Data

US 2015/0237735 A1 Aug. 20, 2015

Related U.S. Application Data

(63) Continuation of application No. 14/134,650, filed on Dec. 19, 2013, now Pat. No. 9,055,644, which is a
(Continued)

(30) Foreign Application Priority Data

Aug. 23, 2010 (JP) .................................. 2010-185826
Aug. 27, 2010 (JP) .................................. 2010-191117

(51) Int. Cl.
*F21V 23/00* (2015.01)
*H05K 1/18* (2006.01)
(Continued)

(52) U.S. Cl.
CPC ............... *H05K 1/189* (2013.01); *F21V 3/02* (2013.01); *F21V 23/009* (2013.01); *F21V 29/83* (2015.01);
(Continued)

(58) Field of Classification Search
CPC ... H05B 33/0842; H05B 33/086; F21V 14/04; F21Y 2101/02; F21Y 2111/002
See application file for complete search history.

(56) References Cited

U.S. PATENT DOCUMENTS 5,084,804 A 1/1992 Schairer
5,489,827 A 2/1996 Xia
(Continued)

FOREIGN PATENT DOCUMENTS

CN 2587107 Y 11/2003
CN 2894096 Y 4/2007
(Continued)

*Primary Examiner* — Ali Alavi
(74) *Attorney, Agent, or Firm* — Fish & Richardson P.C.

(57) ABSTRACT

Of the various technological features disclosed in the present specification, a structure according to the one technological feature is as follows. A lighting apparatus changeable between an illuminating state and a non-illuminating state comprising: a non-contact motion sensor arranged to sense a movement of a hand near the lighting apparatus; and a controller arranged to control the lighting apparatus in the non-illuminating state to change from the non-illuminating state to the illuminating state in response to the movement of hand sensed by the non-contact motion sensor, and to control the lighting apparatus in the illuminating state to cause a change in illumination with the illuminating state kept in response to the same movement of hand sensed by the non-contact motion sensor.

19 Claims, 14 Drawing Sheets

Related U.S. Application Data continuation of application No. 13/197,372, filed on Aug. 3, 2011, now Pat. No. 8,730,035.

(51) Int. Cl.
*F21V 29/83* (2015.01)
*F21V 3/02* (2006.01)
*F21Y 111/00* (2016.01)
*F21W 131/30* (2006.01)

(52) U.S. Cl.
CPC ..... *F21W 2131/30* (2013.01); *F21Y 2111/004* (2013.01)

(56) References Cited

U.S. PATENT DOCUMENTS

| | | | |
|---|---|---|---|
| 5,973,608 A | 10/1999 | McMahon | |
| 6,744,223 B2 | 6/2004 | Laflamme et al. | |
| 7,550,931 B2 | 6/2009 | Lys et al. | |
| 7,804,422 B2 | 9/2010 | Liu et al. | |
| 8,063,567 B2 | 11/2011 | Chen | |
| 2005/0052864 A1* | 3/2005 | Colip | F21S 48/212 362/236 |
| 2007/0291198 A1 | 12/2007 | Shen | |
| 2008/0048979 A1 | 2/2008 | Ruttenberg | |
| 2009/0218960 A1 | 9/2009 | Lyons et al. | |
| 2010/0060473 A1 | 3/2010 | Konno et al. | |
| 2010/0091507 A1* | 4/2010 | Li | F21V 7/09 362/470 |
| 2010/0102199 A1 | 4/2010 | Negley et al. | |
| 2010/0277073 A1 | 11/2010 | Van Endert | |
| 2010/0301771 A1 | 12/2010 | Chemel et al. | |
| 2010/0308738 A1 | 12/2010 | Shteynberg et al. | |
| 2011/0084616 A1 | 4/2011 | Negley et al. | |
| 2011/0176289 A1 | 7/2011 | Ramer et al. | |
| 2011/0180687 A1 | 7/2011 | Rains et al. | |
| 2011/0239155 A1 | 9/2011 | Christie | |
| 2012/0287625 A1* | 11/2012 | Macwan | F21V 29/004 362/235 |
| 2014/0304891 A1* | 10/2014 | Waters | A42B 1/244 2/209.13 |

FOREIGN PATENT DOCUMENTS

| | | |
|---|---|---|
| CN | 101055193 A | 10/2007 |
| CN | 101442861 A | 5/2009 |
| CN | 201266371 Y | 7/2009 |
| CN | 101533572 A | 9/2009 |
| CN | 101546233 A | 9/2009 |
| CN | 101667153 A | 3/2010 |
| JP | H02-192605 | 7/1990 |
| JP | 03-233804 | 10/1991 |
| JP | 03-277313 | 12/1991 |
| JP | H04-296491 | 10/1992 |
| JP | 05-166586 | 7/1993 |
| JP | H08-064367 | 3/1996 |
| JP | 2004-303685 | 10/2004 |
| JP | 4238795 B2 | 1/2009 |
| JP | 2011-503789 | 1/2011 |
| WO | 2009/052655 | 4/2009 |
| WO | 2009/059462 | 5/2009 |

* cited by examiner

LIGHTING APPARATUS

CROSS-REFERENCE TO RELATED APPLICATIONS

This application is based on the following Japanese Patent Applications, the content of which is hereby incorporated by reference.
[1] No. 2010-185826 (the filing date: Aug. 23, 2010)
[2] No. 2010-191117 (the filing date: Aug. 27, 2010)

BACKGROUND OF THE INVENTION

1. Field of the Invention

The present invention relates to a lighting apparatus.

2. Description of Related Art

Conventionally, various lighting apparatuses are proposed for various purposes. As a light source that is used in a lighting apparatus, a fluorescent lamp is general; however, in recent years, the use of LEDs also is ongoing. Besides, various propositions for control of lighting apparatuses are performed.

For example, a kitchen apparatus is proposed, which on a front surface of a lighting apparatus that serves as a light source when cooking is performed on a top plate, has a switch apparatus composed of a non-contact type sensor such as an infrared-rays sensor and the like that detect a human body and control turning on-off operation of the light source. And, a proposition is performed, in which a vertical-direction detection area of this sensor is formed between a plane that spreads in front of a sensor front surface and is substantially horizontal with respect to the top plate and a plane that virtually spreads from the sensor front surface to a front edge of the top plate (JP-A-1991-233804).

Besides, a proposition is performed, in which in a similar kitchen apparatus, the sensor detection area is an area that is enclosed by: a virtual vertical plane that spreads from a front surface of a hung door type cabinet which is above the top plate; a plane that spreads in front of the sensor front surface and is substantially horizontal with respect to the top plate; and a virtual plane that spreads from the sensor front surface to the front edge of the top plate (JP-A-1991-277313).

On the other hand, a bathroom, which includes a lighting unit that is able to change a brightness and a color, is proposed, in which a switch in a lighting control box that controls the lighting unit is composed of a non-contact reflection type sensor (JP-A-1993-166586).

However, in connection with the function and control of the lighting apparatus, there are many challenges to be further examined.

SUMMARY OF THE INVENTION

Of various technological features disclosed in the present specification, an object of one technological feature, in light of the above description, is to provide a lighting apparatus that has a useful feature and is easy to control.

Of the various technological features disclosed in the present specification, an embodiment according to the one technological feature provides a lighting apparatus changeable between an illuminating state and a non-illuminating state comprising: a non-contact motion sensor arranged to sense a movement of a hand near the lighting apparatus; and a controller arranged to control the lighting apparatus in the non-illuminating state to change from the non-illuminating state to the illuminating state in response to the movement of hand sensed by the non-contact motion sensor, and to control the lighting apparatus in the illuminating state to cause a change in illumination with the illuminating state kept in response to the same movement of hand sensed by the non-contact motion sensor.

Here, other features, elements, steps, advantages and characteristics disclosed in the present specification will become more apparent from the following detailed description of the best embodiments and from the related attached drawings.

DETAILED DESCRIPTION OF PREFERRED EMBODIMENTS

Embodiment 1

Figure 1:
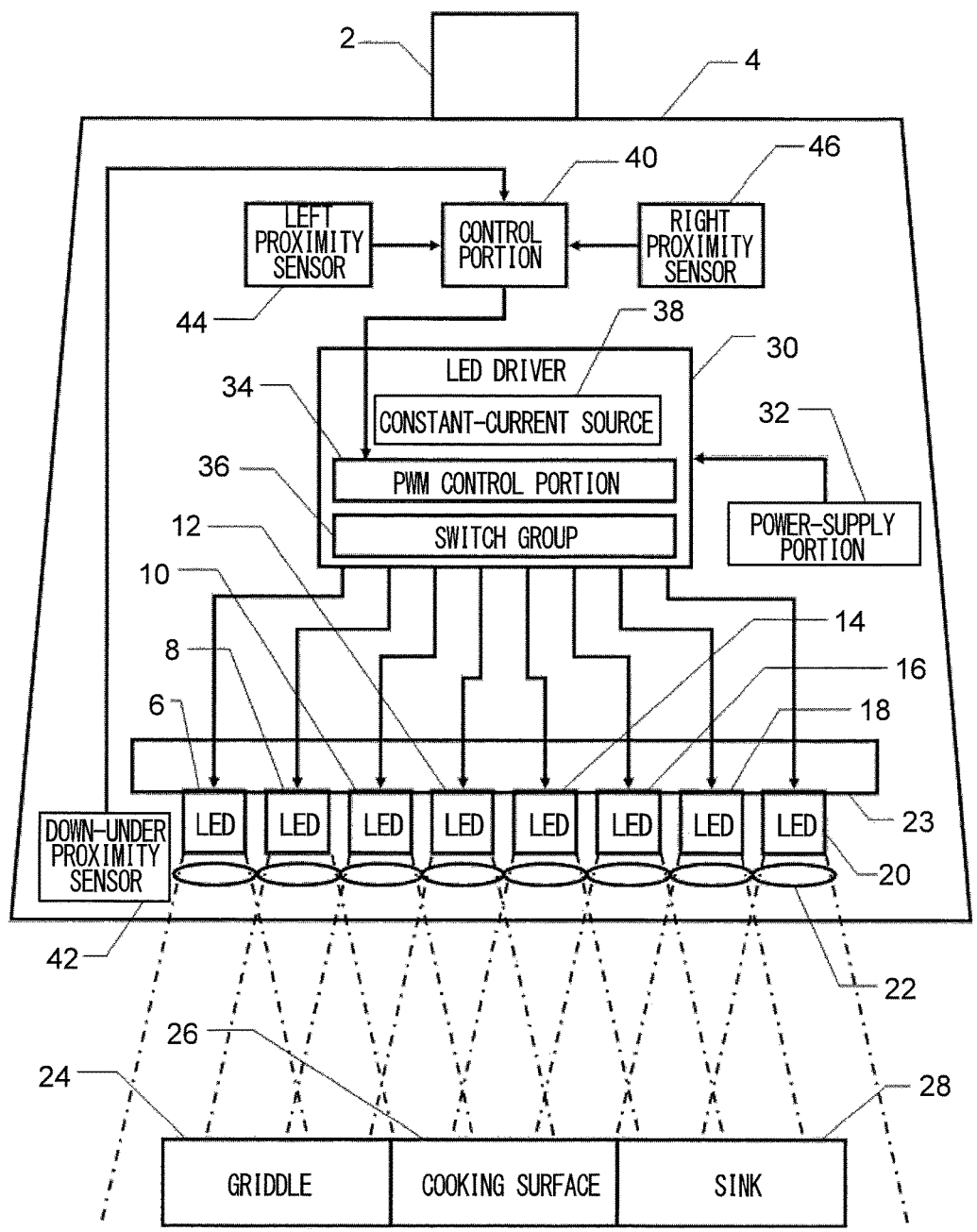
FIG. 1 is a block diagram of a lighting apparatus according to an first embodiment of the present invention (Embodiment 1).

FIG. 1 is a block diagram of a lighting apparatus according to Embodiment 1 of the present invention. Embodiment 1 is formed as a kitchen cooking area lighting apparatus 4 that is fixed at a suitable upper position of a kitchen by a hold portion 2. Here, the block diagram in FIG. 1 is schematically illustrated for convenience of the understanding; however, if description of an actual structure is necessary, the description is suitably supplemented hereinafter. The lighting apparatus 4 has a plurality of white light emitting diodes (LED) 6, 8, 10, 12, 14, 16, 18 and 20; collects white light, emitted into a relatively wide angle from the diodes, by means of small lens groups of a light collection lens array 22 that is disposed on a front surface; and radiates the light downward. Besides, each white light LED is in thermal contact with a heat radiation plate 23 that is formed of a metal; and prevents deterioration of the light emission efficiency by means of cooling by the heat radiation plate 23. Here, in FIG. 1, only eight white light LEDs are shown for simplification; however, in practical application, many white light LEDs (e.g., hundreds of LEDs) are so disposed as to be a circular shape as a whole. Below the lighting apparatus 4, kitchen utensils such as a griddle 24 like a gas cooking apparatus, a cooking surface 26, a sink 28 and the like that need to be lighted are situated.

A LED driver 30 receives electricity supply from a power supply portion 32 and supplies an electric current from a constant-current source 38 to the white light LEDs 6, 8, 10, 12, 14, 16, 18 and 20 via a switch group 36 that is turned on and off by a PWM control portion 34, thereby performing the light emission control. The light emission control is performed by the control portion 40 controlling the PWM control portion 34. First, to turn on the lighting apparatus 4, a hand is moved below and near a down-under proximity sensor 42. If it is determined by the control portion 40 that some change is present in an output from the down-under proximity sensor 42, a turning-on signal is sent to the PWM control portion 34; whereby the white light LEDs 6, 8, 10, 12, 14, 16, 18 and 20 are turned on irrespective of directions of the hand movement. Here, as the turning-on state, the state at the previous turning-off time is restored.

Next, to change a brightness of the lighting apparatus 4, the hand is moved in a right-left direction below and near the down-under proximity sensor 42. If the control portion 40 detects a from-left-to-right movement of the hand in accordance with an output change from the down-under proximity sensor 42, as long as a duty cycle is not at an upper limit, a signal for increasing the duty cycle by a predetermined amount is sent to the PWM control portion 34, so that the brightness of the white light LEDs 6, 8, 10, 12, 14, 16, 18 and 20 increases. On the other hand, if the control portion 40 detects a from-right-to-left movement of the hand in accordance with the output change from the down-under proximity sensor 42, as long as the duty cycle is not at a lower limit, a signal for decreasing the duty cycle by a predetermined amount is sent to the PWM control portion 34, so that the brightness of the white light LEDs 6, 8, 10, 12, 14, 16, 18 and 20 decreases. Further, if the control portion 40 detects a quickly moved-away movement of the hand from the vicinity of the down-under proximity sensor 42 in accordance with the output change from the down-under proximity sensor 42, a turning-off signal is sent to the PWM control portion 34, so that the white light LEDs 6, 8, 10, 12, 14, 16, 18 and 20 are turned off.

Here, in the above description, when the hand that performs the light increase or the light decrease moves away from the down-under proximity sensor 42, to prevent unintentional light increase or light decrease due to the moving-away movement from being performed, an invalidation time zone is set, in which if the hand is stopped for a predetermined time after a desired light increase or decrease operation is completed, the output change is invalidated for a predetermined time from that time. Accordingly, if the hand is slowly moved away in this invalidation time zone, unintentional light increase or light decrease due to this movement does not occur. Besides, to prevent the hand movement that approaches the down-under sensor 42 before the quick moving-away for the turning-off from being mistaken as the operation for the light increase or light decrease, only the turning-off based on the determination of the quick moving-away is performed during a predetermined time after the down-under proximity sensor 42 detects the output change for the first time. And, only when it is not determined that the quick moving-away is performed during this predetermined time, the light increase or light decrease is performed in accordance with the hand movement. Accordingly, the turning-off is performed immediately after detection of the quick hand moving-away, while the light increase or light decrease is performed with a slight lag after detection of the right-left hand movement.

As described above, the determination by the control portion 40 is different when the lighting apparatus 4 is in the turned-off state versus when the lighting apparatus 4 is in the turned-on state. In other words, in the case where the lighting apparatus 4 is in the tuned-off state, the turning-on control is performed irrespective of the hand movement, while in the case where the lighting apparatus 4 is in the tuned-on state, the different control, that is, the light increase, the light decrease or the turning off is performed by determining difference in the hand movement.

Here, in the above description, instead of the turned-off state, the white light LEDs 6, 8, 10, 12, 14, 16, 18 and 20 may be turned on at a small duty cycle to function as a night light. In this case, the "turning off" in the above description is replaced with the "night light turning on" for the understanding. Besides, it is also possible to predetermine whether to perform the "turning off" or to perform the "night light turning on" when the lighting is not performed. Besides, in the "night light turning on," all the white light LEDs 6, 8, 10, 12, 14, 16, 18 and 20 are turned on at the small duty cycle such that difference in the lives does not occur. However, a special emphasis is not laid on difference of the lives, only the white light LEDs (e.g., the white light LEDs 16, 18 and 20 over the sink 28) that are predetermined for the "night light turning on" may be selectively turned on at the small duty cycle.

Next, when the lit area is changed, the hand is moved near either or both of a left proximity sensor 44 and a right proximity sensor 46. Here, the left proximity sensor 44 and the right proximity sensor 46 are disposed on upper side portions of the lighting apparatus 4 such that the hand does not obstruct the setting of the lit area. Here, in FIG. 1, for simplification, as the proximity sensors for changing the lit area, the pair of the left proximity sensor 44 and the right proximity sensor 46 are used; however, in practical application, a plurality of sensors are disposed along the upper circumferential side surface of the lighting apparatus 4, so that it is possible to detect the hand movement from any direction around a vertical axis of the lighting apparatus 4. Because of this, it becomes possible to move the lit area in any direction around the vertical axis of the lighting apparatus 4. Hereinafter, the lit area change is specifically described based on only the pair of the left proximity sensor 44 and the right proximity sensor 46 for simplification.

First, a case where a spread of the lit area is changed is described. To reduce the lit area, the left hand and the right hand are made to slowly approach the left proximity sensor 44 and the right proximity sensor 46, respectively. If the approaches of both hands are detected by the control portion 40 based on output changes from the left proximity sensor 44 and the right proximity sensor 46, as long as the lit area is not at a lower limit, a predetermined number of white light LEDs arranged in a ring-belt shape are turned off from outside around the vertical axis of the lighting apparatus 4. Here, in a case where all the white light LEDs 6, 8, 10, 12, 14, 16, 18 and 20 are in the turned-on state, an upper limit is set on the duty cycle considering the limit of heat radiation capability of the heat radiation plate 23; however, when part of the LEDs are in the turned off state as described above, part of the heat radiation capability is reserved, so that it is possible to raise the upper limit of the duty cycle. Making use of this fact, when the white light LEDs arranged in a ring-belt shape on an outward side are turned off to reduce the lit area; at the same time, the duty cycle of the remaining white light LED groups on an inward side is automatically increased. According to this, it is possible to reduce the lit area and achieve a spot lit state with the brightness of the area increased.

On the other hand, to enlarge the lit area, the left hand and the right hand are made to quickly approach the left proximity sensor 44 and the right proximity sensor 46, respectively; thereafter, made to slowly move away. Here, to prevent the approach movements of both hands from being mistaken as the above lit area reduction operation, a structure is employed such that a quick approach at more than a predetermined speed is not recognized as the lit area reduction operation. When the moving-away movements of both hands are detected by the control portion 40 based on the output changes from the left proximity sensor 44 and the right proximity sensor 46, as long as the lit area is not at the upper limit (in other words, all the white light LEDs are in the turned-on state), of the white light LEDs in the turned-off state, LEDs arranged in a predetermined number of ring-belt shapes are turned on beginning with the inward side around the vertical axis of the lighting apparatus 4. Here, as the number of white light LED groups that are turned on increases, the duty cycle of the turned-on white light LED groups is automatically lowered considering the limit of the heat radiation capability of the heat radiation plate 23. Here, the light emission from each white light LED is curbed; however, the total light amount in the lit area is kept.

Next, a case where the lit area is moved is described. As an example, a state is examined, in which thanks to the above lit area reduction operation, for example, the white light LEDs 10, 12, 14, and 16 are turned on and the white light LEDs 6, 8, 18, and 20 are turned off, whereby the cooking surface 26 is lit with spot-like light. Here, to move the lit area to the sink 28 that is situated on the right side, the left hand is made to approach the left proximity sensor 44. If this movement is detected by the control portion 40, for example, the white light LED 10 is turned off and the white light LED 16 is turned on, so that the lit area moves toward the sink 28. And, to further move the lit area toward the sink 28, the left hand is temporarily moved away from the left proximity sensor 44; thereafter, is made to approach again. When only the output from the left proximity sensor 44 changes, the control portion 40 neglects the moving-away movement, so that the re-approach only is detected; in accordance with this, for example, the white light LED 12 is turned off and the white light LED 20 is turned on, so that the lit area comes over the sink 28. Linear movements are described above; however, in practical application, a lighting spot moves rightward. Besides, there are many steps for the spot, so that the spot moves more smoothly.

On the other hand, to move the lit area leftward, by repeating the right-hand approach to the right proximity sensor 46, like the case of the above left proximity sensor 44, the lit area moves leftward. For example, starting from a state in which the white light LEDs 14, 16, 18, and 20 are turned on and the white light LEDs 6, 8, 10, and 12 are turned off, whereby the sink 28 is lit with spot-like light, the right hand is made to approach the right proximity sensor 46. If this movement is detected by the control portion 40, for example, the white light LED 20 is turned off and the white light LED 12 is turned on, so that the lit area moves toward the cooking surface 26. And, to further move the lit area toward the cooking surface 26, the right hand is temporarily moved away from the right proximity sensor 46; thereafter, is made to approach again. In a similar way to the case of the left proximity sensor 44, when only the output from the right proximity sensor 46 changes, the control portion 40 neglects the moving-away movement, so that the re-approach only is detected; in accordance with this, for example, the white light LED 18 is turned off and the white light LED 10 is turned on, so that the lit area comes over the cooking surface 26. By repeating this movement, it is possible to move the lit area over the griddle 24.

Figure 2:
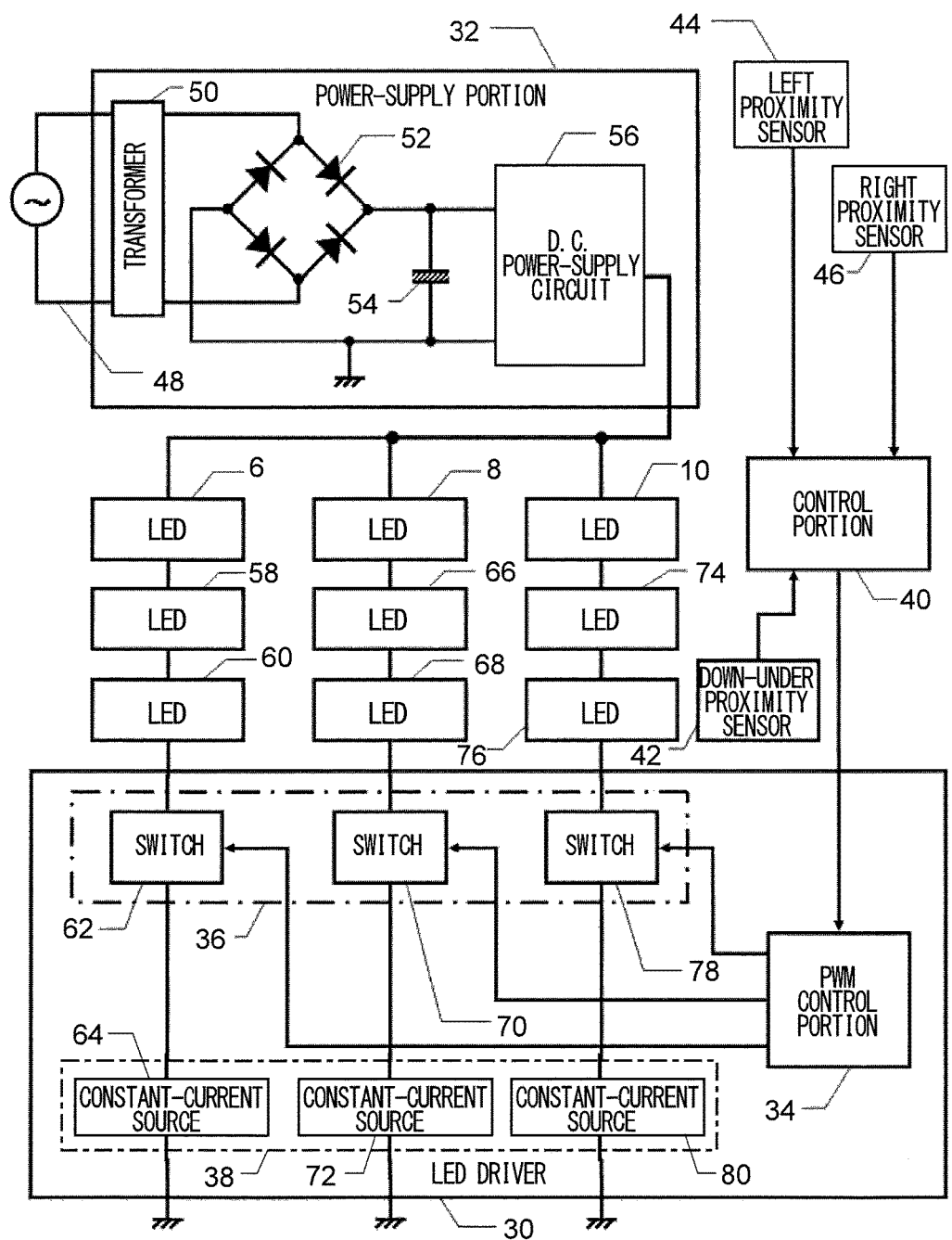
FIG. 2 is a circuit block diagram in the Embodiment 1.

FIG. 2 is a circuit block diagram in Embodiment 1 in FIG. 1; portions corresponding to FIG. 1 are indicated by the same reference numbers and description is skipped unless necessary. The power supply portion 32 lowers an alternating voltage from a power line 48 by means of a transformer 50; rectifies the alternating voltage by means of a full-wave rectifier 52; smoothes the voltage by means of an electrolytic capacitor 54; and supplies the voltage to a direct current power supply circuit 56. Here, a structure may be employed, in which the transformer 50 is omitted; and the voltage is directly supplied to the full-wave rectifier 52 from the power line 48. Between the d.c. power supply circuit 56 and ground, a group of white light LEDs 6, 58, and 60, a switch device 62 and a constant-current source 64 are connected in series. In parallel with this, between the d.c. power supply circuit 56 and ground, a group of white light LEDs 8, 66, and 68, a switch device 70 and a constant-current source 72 are connected in series. Further, between the d.c. power supply circuit 56 and the ground, in parallel with these, a group of white light LEDs 10, 74, and 76, a switch device 78 and a constant-current source 80 are connected in series. And, on-off of the switch devices 62, 70 and 78 is controlled by the PWM control portion 34, whereby the turning on-off of the white light LED groups and the brightness adjustment during a turned-on time are performed. The duty cycle for the PWM control by the PWM control portion 34 is controlled by the control portion 40.

Here, in FIG. 2, only the three series connections of the white light LED groups are shown; however, in practical application, a structure is employed such that the duty cycle is controllable separately for each series connection of many white light LED groups. Besides, a structure may be employed such that the duty cycle is not controlled for each series connection but controlled for each of groups in one of which several series connections are clustered to be parallel with each other. Here, a duty cycle 0 means the turning off.

Figure 3:
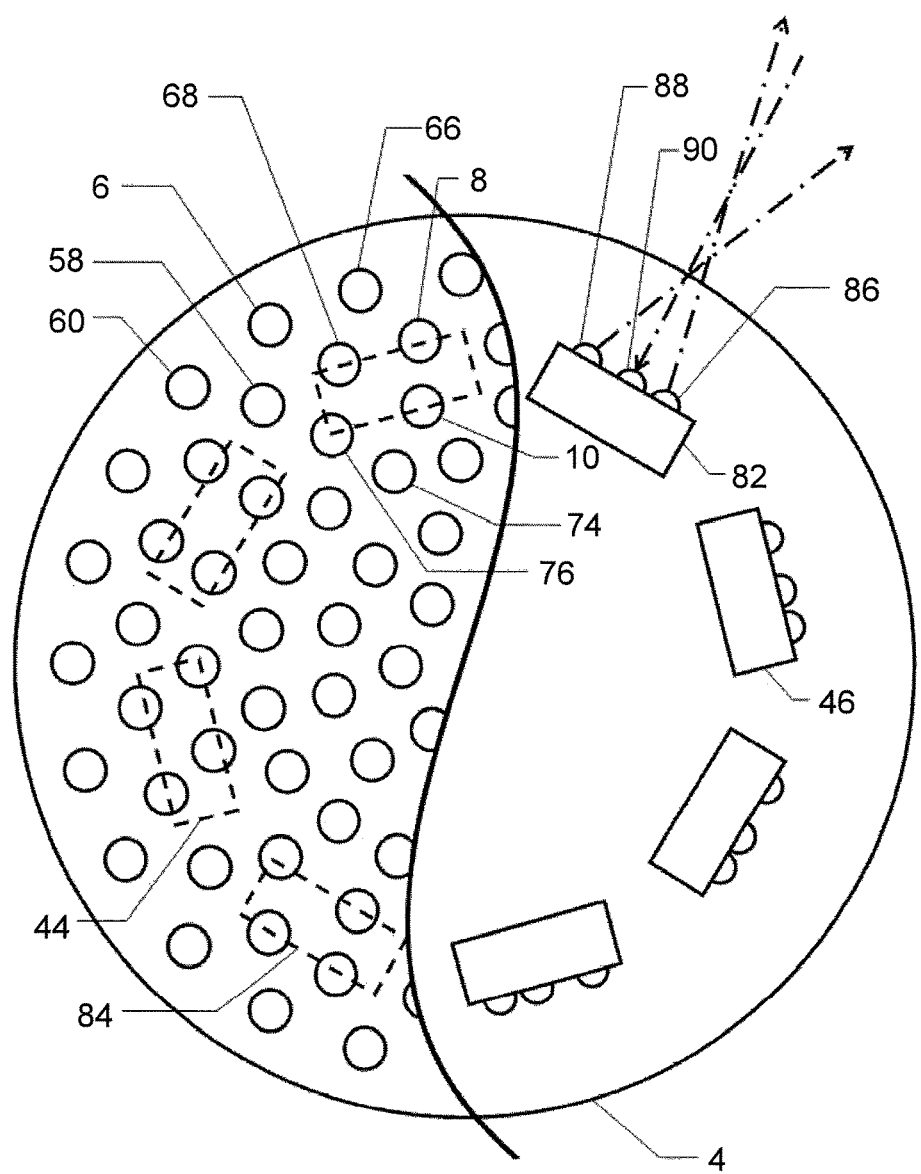
FIG. 3 is a schematic view of planar disposition in the Embodiment 1.

FIG. 3 is a schematic view of the planar disposition in FIG. 1 and FIG. 2; portions corresponding to FIG. 1 and FIG. 2 are indicated by the same reference numbers and description is skipped unless necessary. As is clear from FIG. 3, the white light LEDs are so arranged to be in a circular-surface shape as a whole. Besides, the white light LEDs 6, 58, and 60 and the like, which are connected in series and undergo the same control, are disposed near to each other as control units. And, corresponding to FIG. 1 and FIG. 2, the white light LEDs 8, 66, and 68 of a control unit are disposed in an inward portion of the circle as a whole; besides, the white light LEDs 10, 74, and 76 of a control unit are disposed in a more inward portion of the circle as a whole. Here, the planar disposition of the white light LED groups is not limited to the circle shape in FIG. 3: suitable shapes such as an ellipse shape, a rectangle shape and the like are possible.

Besides, as already described above, not only the pair of the left proximity sensor 44 and the right proximity sensor 46 but also a plurality of pairs of sensors such as a third side proximity sensor 82 and a fourth side proximity sensor 84 opposite to the third side proximity sensor 82 and the like are disposed around the vertical axis of the lighting apparatus 4, so that it is possible to detect the hand approach from any direction. Because of this, it also becomes possible to move the lit area in any direction around the vertical axis of the lighting apparatus 4. Here, the left proximity sensor 44, the right proximity sensor 46, the third side proximity sensor 82 and the fourth side proximity sensor 84 each have a first infrared-rays emitting portion 86, a second infrared-rays emitting portion 88 and a common infrared-rays receiving portion 90. Details of them are described later.

Figure 4:
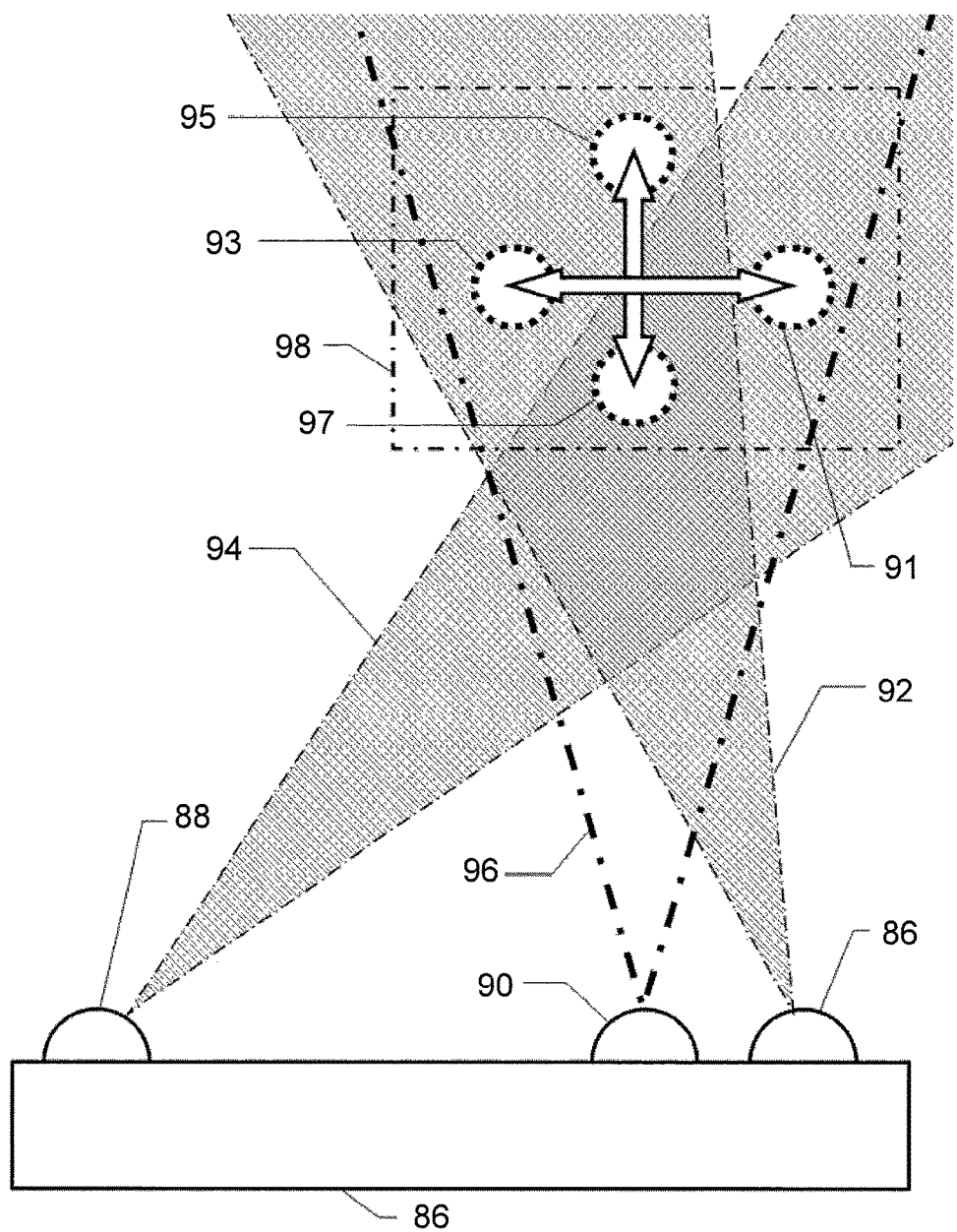
FIG. 4 is a schematic view showing a detailed structure of a proximity sensor in the Embodiment 1.

FIG. 4 is a schematic view showing a detailed structure of the down-under proximity sensor 42, the left proximity sensor 44, the right proximity sensor 46, the third side proximity sensor 82 and the fourth side proximity sensor 84 and the like in Embodiment 1 in FIG. 1 to FIG. 3; portions corresponding to FIG. 1 to FIG. 3 are indicated by the same reference numbers and description is skipped unless necessary. The first infrared-rays emitting portion 86 radiates infrared-rays pulses to a radiation area 92 at predetermined timing. Besides, the second infrared-rays emitting portion 88 radiates infrared-rays pulses to a radiation area 94 at timing that does not overlap with the pulses from the first infrared-rays emitting portion 86. The common infrared-rays receiving portion 90 applies sampling to infrared-rays reflection light in a light receiving area 96 at the infrared-rays pulse radiation timing of the first infrared-rays emitting portion 86, at the infrared-rays pulse radiation timing of the second infrared-rays emitting portion 88, and at timing where the infrared-rays pulses from both are not present; and from a comparison of these samplings, detects movements of a finger and the like in a sensing region 98.

For example, as for a left-right movement in FIG. 4, for example, when a finger and the like move from a position 91 to a position 93 in the sensing region 98, a state transition occurs from a state in which pulses from the second infrared-rays emitting portion 88 are reflected by the finger and only the reflection light is received, via a state in which pulses from both of the first infrared-rays emitting portion 86 and the second infrared-rays emitting portion 88 are reflected by the finger and the reflection light of both pulses is received, and to a state in which pulses from the first infrared-rays emitting portion 86 are reflected by the finger and only the reflection light is received. According to this, a from-right-to-left finger movement in FIG. 4 is detected. On the other hand, when the finger and the like move from the position 93 to the position 91 in the sensing region 98, the state transition of the light receiving states of the reflection light becomes reverse, so that a from-left-to-right finger movement in FIG. 4 is detected.

On the other hand, as for a vertical movement in FIG. 4, for example, when the finger and the like move from a position 95 to a position 97 in the sensing region 98, a state transition occurs from a state in which pulses from the first infrared-rays emitting portion 86 are reflected by the finger and only the reflection light is received to a state in which pulses from both of the first infrared-rays emitting portion 86 and the second infrared-rays emitting portion 88 are reflected by the finger and the reflection light of both pulses is received. According to this, a from-top-to-bottom finger movement in FIG. 4 is detected. On the other hand, when the finger and the like move from the position 97 to the position 95 in the sensing region 98, the state transition of the light receiving states of the reflection light becomes reverse, so that a from-bottom-to-top finger movement in FIG. 4 is detected.

As described above, a case where a relatively small object such as the finger and the like moves in the sensing region 98 is described; however, in a case of a relatively large object such as a palm and the like, the received light output is a combination of reflection light from portions of the palm. In this case, as for the left-right movement in FIG. 4, it is possible to detect the movement relatively easily from an end-portion movement of the palm. On the other hand, in the case of the vertical movement in FIG. 4, the state continues, in which pulses from both of the first infrared-rays emitting portion 86 and the second infrared-rays emitting portion 88 are reflected by the entire palm and the reflection light of both pulses is received. In such a case, increase or decrease in the reflection light amount is detected; and it is determined as an approach in a case where the reflection light amount increases and it is determined as a moving-away in a case where the reflection light amount decreases. Here, in the vertical movement as well, if the palm is moved in parallel with the movement direction, the reflection area becomes small, so that it is possible to detect the reflection state transition as in FIG. 4. Here, in FIG. 4, the case where there are the two infrared-rays emitting portions is described; however, to increase the sensitivity, it is possible to increase the number of infrared-rays emitting portions; besides, in this case, it is possible to dispose the infrared-rays emitting portions two-dimensionally or three-dimensionally; or it is possible to increase the number of infrared-rays receiving portions 90.

Figure 5:
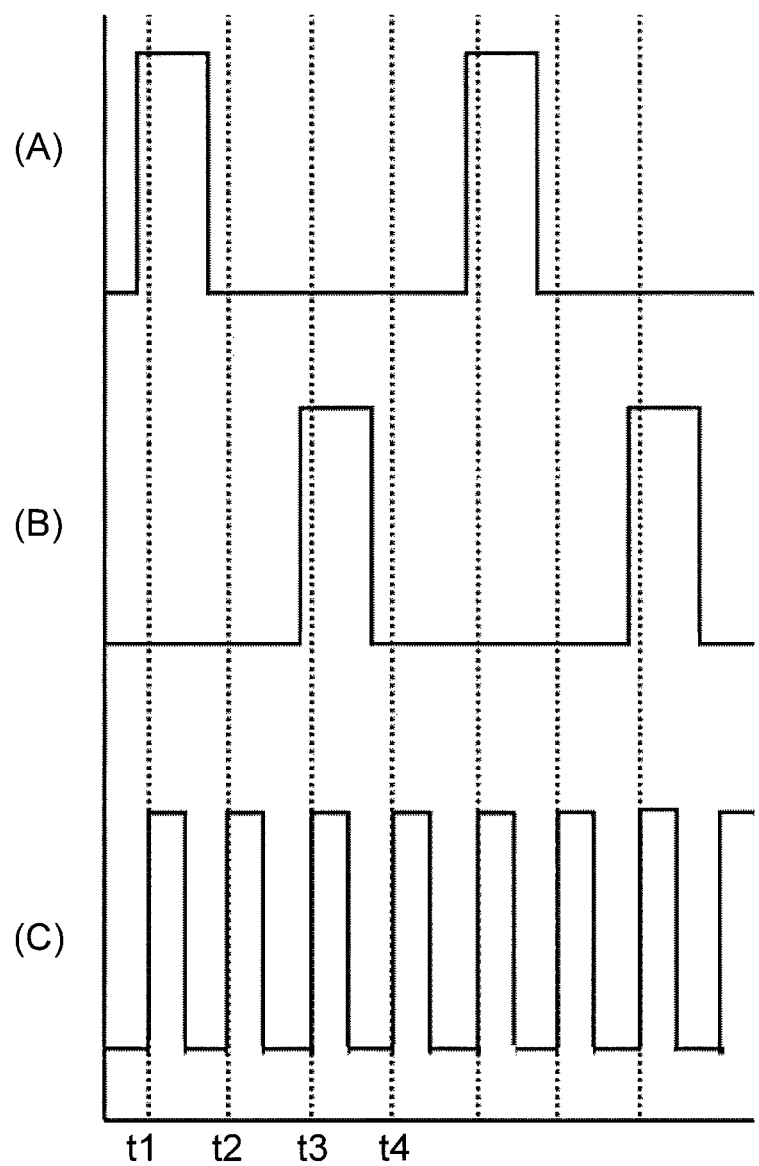
FIG. 5 is a timing chart that shows pulse emission timing and reflection light sampling timing of the proximity sensor in the Embodiment 1.

FIG. 5 is a timing chart that shows: the pulse radiation timing of the first infrared-rays emitting portion 86 and the second infrared-rays emitting portion 88 of each of the down-under proximity sensor 42, the left proximity sensor 44, the right proximity sensor 46, the third side proximity sensor 82 and the fourth side proximity sensor 84: and the reflection light sampling timing of the common infrared-rays receiving portion 90. FIG. 5 (A) shows the pulse radiation timing of the first infrared-rays emitting portion 86; FIG. 5 (B) shows the pulse radiation timing of the second infrared-rays emitting portion 88; and FIG. 5 (C) shows the reflection light sampling timing of the common infrared-rays receiving portion 90. The pulse radiations in FIG. 5 (A) and FIG. 5(B) are repeated at about 100 Hz, for example. As is clear from FIG. 5, the received light output sampling is performed likewise in order from: timing t1 when only the pulses from the first infrared-rays emitting portion 86 are radiated; timing t2 when neither of both pulse radiations is present; timing t3 when only the pulses from the second infrared-rays emitting portion 88 are radiated; and to timing t4 when neither of both pulse radiations is present. As described above, before and after both of the reflection light samplings during the pulse radiation only from the first infrared-rays emitting portion 86 and the pulse radiation only from the second infrared-rays emitting portion 88, the received light sampling in the state having no pulse radiation is performed, so that it is possible to effectively remove reflected light output other than the reflection light.

Embodiment 2

Figure 6:
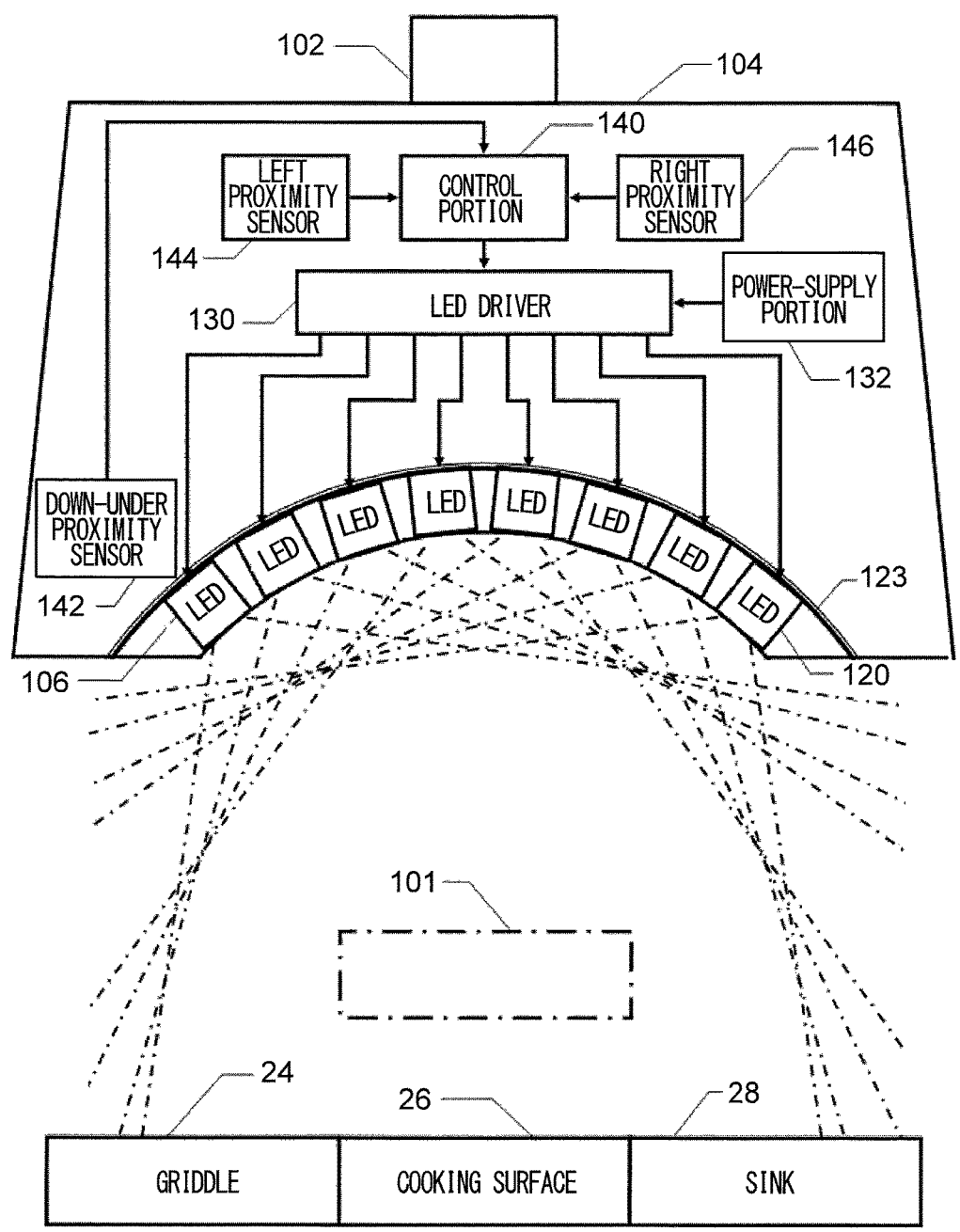
FIG. 6 is a block diagram of a lighting apparatus according to a second embodiment of the present invention (Embodiment 2).

FIG. 6 is a block diagram of a lighting apparatus according to Embodiment 2 of the present invention. Embodiment 2 also is formed as a kitchen cooking area lighting apparatus 104 that is fixed at a suitable upper position of a kitchen by a hold portion 102. Besides, because most of the structure is common to Embodiment 1, the common portions are indicated by reference numbers on the order of 100 with the common second and first digits and description is skipped unless necessary. Besides, the detailed structures shown in FIG. 2 to FIG. 5 are also applicable to Embodiment 2 and other embodiments that are described hereinafter. What Embodiment 2 in FIG. 6 is different from Embodiment 1 in FIG. 1 is a point that white light LEDs 106 to 120 are disposed on an inward bent surface and the light collection lens array 22 disposed in Embodiment 1 is omitted. Because of this, a heat radiation plate 123 also has an inward bent shape.

As a result of the above structure, even without the light collection lens array 22, it is possible to efficiently shine the illumination light onto the kitchen utensils such as the griddle 24, the cooking surface 26, the sink 28 and the like that are below the lighting apparatus 104 and need the lighting. On substantially a center portion 101 of the bent shape of the white light LEDs 106 to 120 and the heat radiation plate 123, the light from all the white light LED groups concentrates, so that if there is an ingredient or a dish that the user wants to look in a bright state, it is sufficient to lift them to the center portion 101. Here, in Embodiment 2, the surface on which the white light LEDs 106 to 120 are disposed is part of a spherical surface; as a result of this, the light emission center axes of the white light LED groups concentrate on the center portion 101; however, to perform the disposition such that the light emission center axes of the white light LED groups are not parallel to each other, it is possible not only to perform the disposition on the simple spherical surface but also to minutely design considering the illuminance on a lit target surface.

Here, in the case of moving the lit area, to move the lit area toward the sink 28, the left hand is made to approach the left proximity sensor 144; if this movement is detected by a control portion 140, for example, a state is obtained, in which the white light LED group on the white light LED 120 side is turned off while the white light LED group on the white light LED 106 side is turned on. On the other hand, to move the lit area toward the griddle 24, the right hand is made to approach the right proximity sensor 146; if this movement is detected by the control portion 140, for example, a state is obtained, in which the white light LED group on the white light LED 106 side is turned off while the white light LED group on the white light LED 120 side is turned on.

Figure 7:
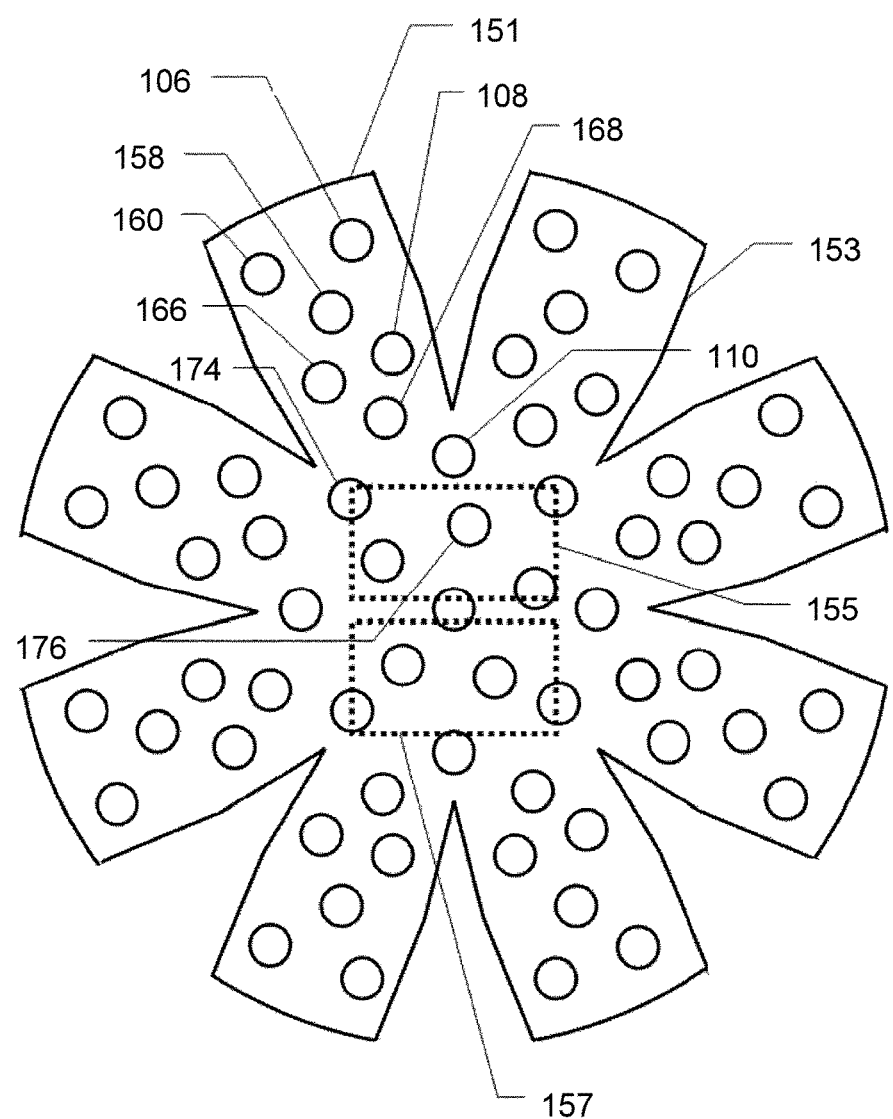
FIG. 7 is a development view of a white light LED mount flexible board in the Embodiment 2.

FIG. 7 is a development view of a flexible board for mounting the white light LED group in Embodiment 2 in FIG. 6. A flexible board 151 incorporates a group of white light LEDs 106, 158 and 160 and a group of white light LEDs 108, 166 and 168 and the like; has cutout pieces 153 and the like; and by attaching the cutout pieces 153 on the inner side of the heat radiation plate 123 such that the cutout pieces are in contact with each other at their tip end portions, it is possible to dispose the white light LED groups on the inward bent surface in section shown in FIG. 6 as a whole. Here, control related circuit elements 155, 157 such as an LED driver and the like are disposed at a center of the flexible board 151 such that a wiring is not cut by the cutout piece 153; from here, the wiring extends radially as a whole to control the white light LED groups.

Embodiment 3

Figure 8:
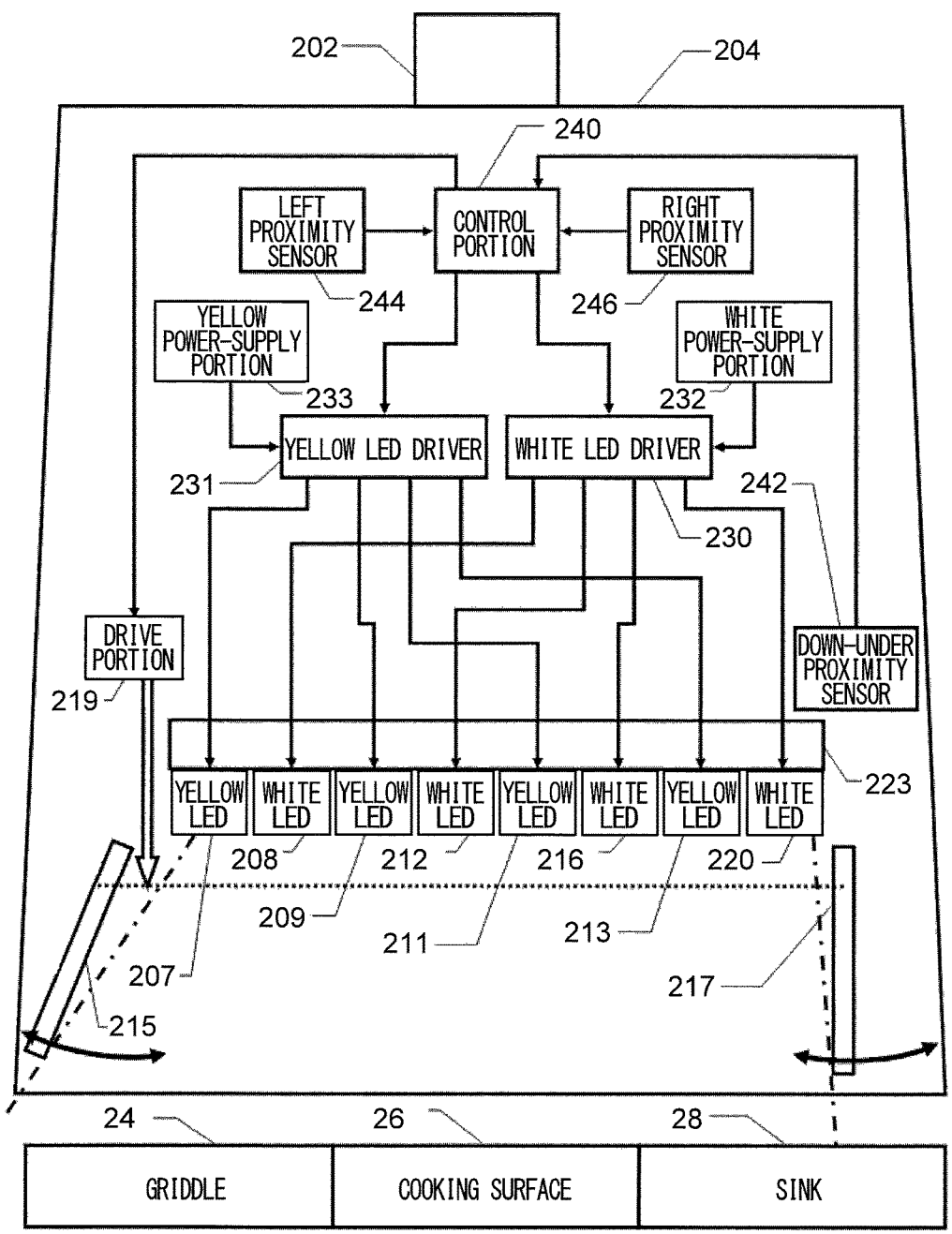
FIG. 8 is a block diagram of a lighting apparatus according to a third embodiment of the present invention (Embodiment 3).

FIG. 8 is a block diagram of a lighting apparatus according to Embodiment 3 of the present invention. Embodiment 3 also is formed as a kitchen cooking area lighting apparatus 204 that is fixed at a suitable upper position of a kitchen by a hold portion 202. Besides, because most of the structure is common to Embodiment 1 and Embodiment 2, the common portions are indicated by reference numbers on the order of 200 with the common second and first digits and description is skipped unless necessary. A first point in which Embodiment 3 in FIG. 8 is different from Embodiment 1 in FIG. 1 or e Embodiment 2 in FIG. 6 is that white light LEDs 208, 212, 216, 220 and the like are evenly mingled with yellow light LEDs 207, 209, 211, 213 and the like.

And, the white light LEDs 208, 212, 216, 220 and the like are controlled by a white light LED driver 230 that is supplied with electricity by a white light power supply portion 232; independent of this, the yellow light LEDs 207, 209, 211, 213 and the like are controlled by a yellow light LED driver 231 that is supplied with electricity by a yellow light power supply portion 233. According to this, by means of changes of the duty cycle of the whit light LED group and the duty cycle of the yellow light LED group, it is possible to freely change the mixing ratio of the white and the yellow and change the lighting color between the white and the yellow. Such change of the lighting color in a kitchen is useful in a case and the like where for example, the color of a dish or an ingredient is evaluated under the same conditions as day time color temperatures and color temperatures during a light lighting time in a dining room at a time of setting a table.

A second point in which Embodiment 3 in FIG. 8 is different from Embodiment 1 in FIG. 1 or Embodiment 2 in FIG. 6 is that a structure is employed, in which movable reflection shades 215, 217 are disposed and driven in cooperation with each other by a drive portion 219, whereby it is possible to change the radiation direction of the illumination light. FIG. 8 shows, as an example, a state in which it is adjusted such that the lighting direction points to the griddle 24. Here, in Embodiment 3 in FIG. 8, like in Embodiment 2 in FIG. 6, the light collection lens array 22 disposed in Embodiment 1 in FIG. 1 is omitted. The drive portion 219 is controlled by the control portion 240; the movable reflection shades 215 and 217 are driven such that the left hand is made to approach a left proximity sensor 244, whereby the lit area moves toward the sink 28; while the right hand is made to approach a right proximity sensor 246, whereby the lit area moves toward the griddle 24.

Further, when changing the lit area between a spot and a wide angle by making the left hand and the right hand approach and move away from the left proximity sensor 244 and the right proximity sensor 246, respectively, the drive control is performed such that the movable reflection shades 215 and 217 move in a closed direction or an opened direction as a whole in cooperation with each other. Here, in Embodiment 3 in FIG. 8, unlike Embodiment 1 and Embodiment 2, the change of the turning-on and turning-off of the white light LED group and the yellow light LED group due to the spreading of the lit area or the movement of the center of the lit area is not performed. Only one pair of the left and right movable reflection shades 215 and 217 are shown in FIG. 8 for simplification; however, like the pairs of proximity sensors in FIG. 3, a plurality of pairs of reflection shades are disposed around the vertical axis of the lighting apparatus 204, so that it is also possible to change the lit area in any direction around the vertical axis.

Here, in the case of Embodiment 3, in a case of night light turning-on, all the white light LED groups are turned off, while the yellow light LED groups are turned on at a small duty cycle. Besides, in the case of changing the lighting brightness, to darken the lighting as a whole, automatic control is performed, in which the duty cycle of the white light LED group is made smaller than the duty cycle of the yellow light LED group such that a yellowish color prevails as a whole; on the other hand, to brighten the lighting as a whole, automatic control is performed, in which the duty cycle of the white light LED group is made larger than the duty cycle of the yellow light LED group such that a whitish color prevails as a whole. According to this, by sensuously approximating a color temperature change due to a brightness change of an incandescent lamp and a color temperature change during day time and dusk, a natural brightness change is performed.

Figure 9:
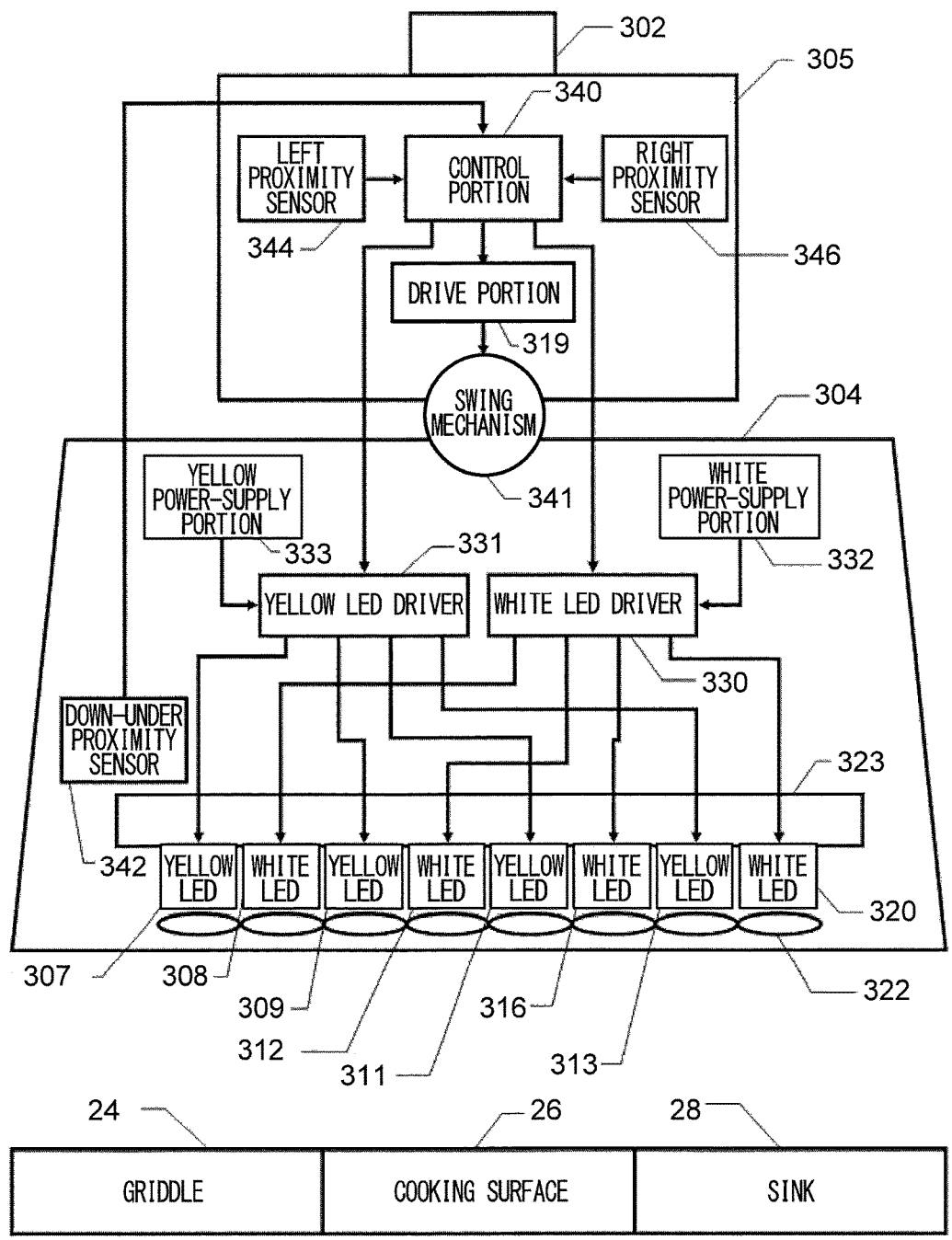
FIG. 9 is a block diagram of a lighting apparatus according to the fourth embodiment of the present invention (Embodiment 4).

FIG. 9 is a block diagram of a lighting apparatus according to the embodiment of the present invention. Embodiment 4 also is formed as a kitchen cooking area lighting apparatus that is fixed at a suitable upper position of a kitchen by a hold portion 302. Besides, because most of the structure is common to Embodiment 3 in FIG. 8, the common portions are indicated by reference numbers on the order of 300 with the common second and first digits and description is skipped unless necessary. A point in which Embodiment 4 in FIG. 9 is different from Embodiment 3 in FIG. 8 is that the kitchen cooking area lighting apparatus is separated into a control fix unit 305 and a movable lighting unit 304; the angle of the control fix unit 305 to the movable lighting unit 304 is variable by a swing mechanism 341; because of this, it is possible to change the lighting direction. Here, like Embodiment 1, to increase the lighting directivity, a light collection lens array 322 is employed. Because of these, the movable reflection shades 215, 217 in Embodiment 3 are not employed in Embodiment 4.

First, a change of the lighting direction in Embodiment 4 is described. A drive portion 319 for controlling the swing mechanism 341 is controlled by a control portion 340; the left hand is made to approach a left proximity sensor 344, whereby the movable lighting unit 304 is tilted in a counterclockwise direction as a whole to light centering on the sink 28 side. On the other hand, the right hand is made to approach a right proximity sensor 346, whereby the movable lighting unit 304 is tilted in a clockwise direction as a whole to light centering on the griddle 24 side.

When changing the lit area between a spot and a wide angle by making the left hand and the right hand approach and move away from the left proximity sensor 344 and the right proximity sensor 346, respectively, like Embodiment 1 and Embodiment 2, the lit area is increased and decreased by means of the turning on and tuning off of the LED group (in this case, the white light LED group and the yellow light LED group). Besides, here, as the number of turned-off LED groups increases, it is the same as Embodiment 1 and Embodiment 2 that the duty cycle of the turned-on LED groups is increased.

The above Embodiment 1 to Embodiment 4 are described with mainly the respective features simplified; it is arbitrary to combine and employ the features described in the respective Embodiments and to change the combination of the features. For example, it is arbitrary to compose Embodiment 1 and Embodiment 2 into the swing type like Embodiment 4; or to compose Embodiment 1 and Embodiment 2 into the mingled type of the white light LED group and the yellow light LED group like Embodiment 3 and Embodiment 4. Besides, in Embodiment 2 and Embodiment 3, it is arbitrary to employ together the light collection lens array used in Embodiment 1 and Embodiment 4. Further, the proximity sensor is not limited to the sensors shown in FIG. 4 and FIG. 5: it is arbitrary to employ other types of proximity sensors that are able to fulfill the same function.

Figure 10:
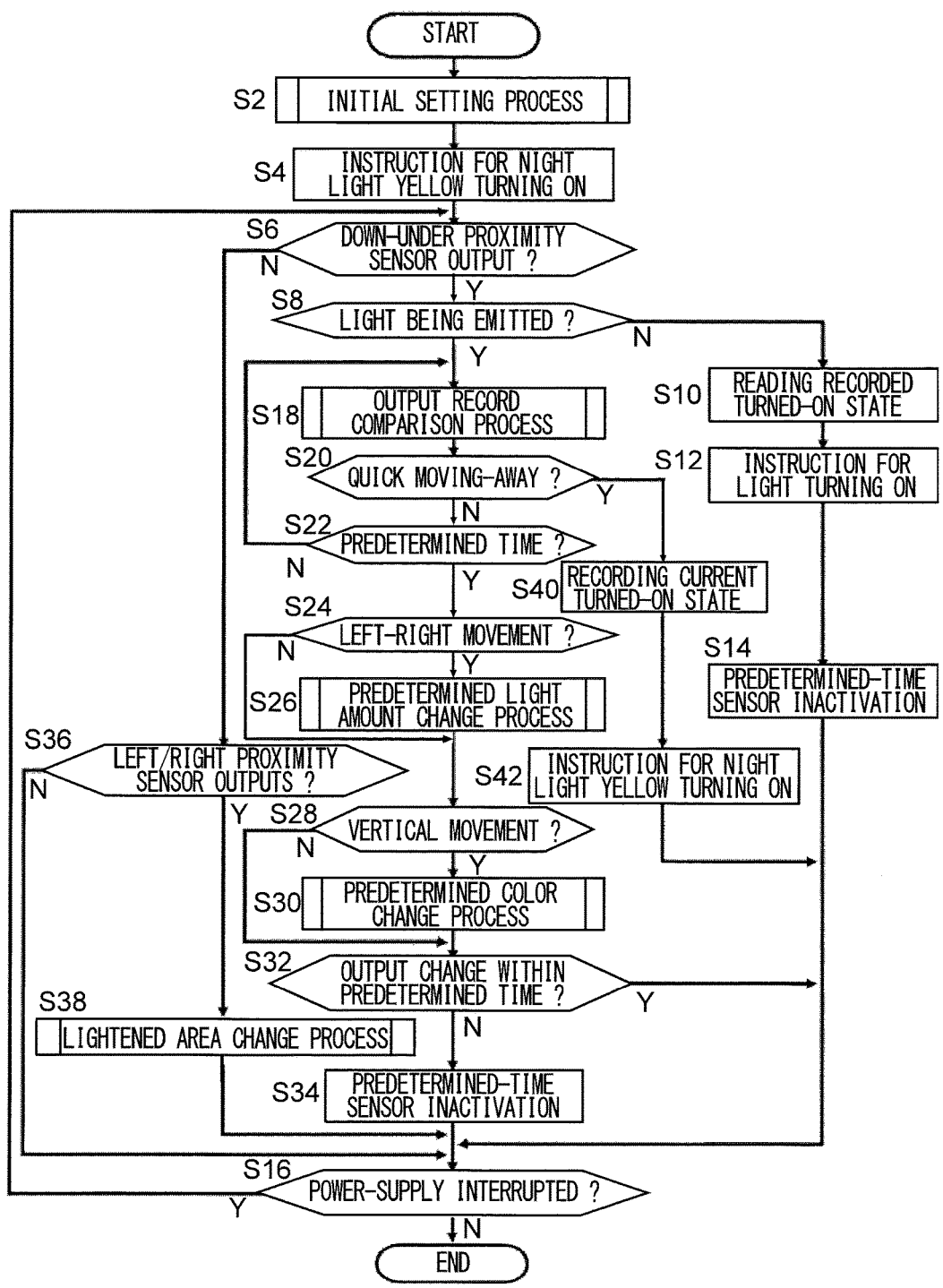
FIG. 10 is a flow chart showing a basic function of a control portion in Embodiment 3 or Embodiment 4.

FIG. 10 is a flow chart showing a basic function of the control portion 240 in Embodiment 3 in FIG. 8 and the control portion 340 in Embodiment 4 in FIG. 9. However, by performing replacement described later, it is possible to employ the flow chart in the control portion 40 in Embodiment 1 in FIG. 1 and the control portion 140 as well in Embodiment 2 in FIG. 6. By disposing the lighting apparatus and supplying electricity, the flow starts to perform an initial stage process in a step S2. This process basically performs a function check of the entire lighting apparatus; however, it is also possible to perform various settings for a limited predetermined time: it is possible to perform custom settings whether or not to perform night light turning-on instead of turning-off; whether or not to perform a color temperature automatic change due to a brightness change; whether or not to perform an automatic brightness change due to a light area change and the like. Here, when nothing is set within the predetermined time, a default setting (the above settings are all "Yes") is performed and the initial setting process is ended. Hereinafter, the flow is described under the default setting.

If the initial setting process ends, the flow goes to a step S4 to issue an instruction for night light yellow turning-on. Next, in a step S6, it is checked whether or not there is a sensor output from the down-under proximity sensor. And, if there is a sensor output, the flow goes to a step S8 to check whether or not light is now being emitted. And, if light is not being emitted, the flow goes to a step S10 to read a recorded turned-on state and goes to a step S12. If there is not a record, the flow goes to the step S12 as default turning-on. In the step S12, an instruction is issued for light turning-on based on the recorded turning-on state read in the step S10. In this way, if it is determined in the step S8 that light is not being emitted, the flow goes to the step S12 whatever the output from the down-under proximity sensor in the step S6 is and an instruction for light turning-on is issued. Here, the recorded turning-on state in the step S10 is a record of brightness, a color temperature, a lit area immediately before the previous turning-off; by passing through the step S10, the lighting state immediately before the previous turning-off is restored.

If an instruction for light turning-on is issued in the step S12, the flow goes to a step S14 and thereafter inactivates the proximity sensor for a predetermined time. This is, for example, to prevent the proximity sensor from detecting a moving-away movement of the hand that is made to approach the proximity sensor for a light turning-on operation and causing an unintentional erroneous operation. If the predetermined time in the step S14 elapses, the flow goes to a step S16 to check whether or not the electricity supply is interrupted; if the supply is kept, the flow returns to the step S6.

On the other hand, if it is detected in the step S8 that light is being emitted, the flow goes to a step S18 to perform an output record comparison process for determination of a hand movement based on a time-dependent change history of the proximity sensor output. And, passing through the output record comparison process in the step S18, the flow goes to a step S20 to check whether or not the hand movement detected by the down-under proximity sensor is a quick moving-away. If it is not a quick moving-away, the flow goes to a step S22 to check whether or not a predetermined time elapses from the time the down-under proximity sensor output is detected for the first time. If the predetermined time does not elapse, the flow returns to the step S18, passes through the output record comparison process based on a new sensor output, and goes to the step S20. In this way, as long as a quick moving-away is not detected and the predetermined time does not elapse, the step S18 to the step S22 are repeated; even if there is a down-under proximity sensor output, noting is performed for a while. In this way, during the time the step S18 to the step S22 are repeated, the flow responds only to detection of a quick moving-away, so that an unintentional erroneous operation is prevented from being caused by the hand that is made to approach the down-under proximity sensor for a quick moving-away.

If the predetermined time elapses in the step S22, the flow goes to a step S24 to check whether or not the hand movement detected in the step S18 is a left-right movement. And, if it is a left-right movement, the flow goes to a step S26 to perform a predetermined light amount change process and goes to a step S28. The predetermined light amount change process in the step S26 is a process to increase or decrease the light amount by a predetermined amount in accordance with whether the movement detected in the step S24 is a rightward movement or a leftward movement; however, details of it are described later. If a left-right movement is not detected in the step S24, the flow directly goes to the step S28.

In the step S28, it is checked whether or not the hand movement detected in the step S18 is a vertical movement. And, if it is a vertical movement, the flow goes to a step S30 to perform a predetermined color change process and goes to a step S32. The predetermined color change process in the step S30 is a process to change the lighting color in a yellow-color direction or a white-color direction in accordance with whether the movement detected in the step S28 is an upward movement or a downward movement; however, details of it are described later. If a vertical movement is not detected in the step S28, the flow directly goes to the step S32. As described above, the operation execution based on a left-right movement or a vertical movement is lagged until a time it is confirmed by the repetition of the step S18 to the step S22 that the hand movement is not a quick moving-away.

In the step S32, it is checked whether or not an output change occurs within a predetermined time based on the down-under proximity sensor output. If the hand that causes an output change from the down-under proximity sensor still moves thereafter, an output change occurs within the predetermined time; however, thereafter, if the hand is stopped, an output change within the predetermined time does not occur. And, if it is detected that there is not an output change within the predetermined time, the flow goes to a step S34; thereafter, during a predetermined time, inactivates the proximity sensor. This is to prevent the proximity sensor from: detecting a moving-away movement of the hand after the hand, which performs the light amount change operation or the color change operation, achieves a predetermined light amount or a predetermined color; and causing an erroneous operation that further generates an unintentional light amount change or color change. If the predetermined time elapses in the step S34, the flow goes to the step S16. On the other hand, if there is an output change within the predetermined time in the step S32, the flow considers that the brightness change or color change operation continues and directly goes to the step S16.

On the other hand, if an output change from the down-under proximity sensor is not detected in the step S6, the flow goes to a step S36 to check whether or not there is an output change from either or both of the left proximity sensor and the right proximity sensor. And, if a sensor output change is detected, the flow goes to a step S38 to perform a lit area change process and goes to the step S16. Details of the lit area change process are described later. On the other hand, if no output change from the left proximity sensor and the right proximity sensor is detected in the step S36, the flow directly goes to the step S16.

On the other hand, if a quick moving-away is detected in the step S20, the flow goes to the step S40 to record the current turning-on state, issues an instruction for night light yellow turning-on in the step S42 and goes to the step S16. As described above, the step S6 to the step S42 are repeated to deal with the operations of keeping the night light yellow turning-on or the light emission, or performing a change between them, and changing the brightness, the color and the lit area.

Figure 11:
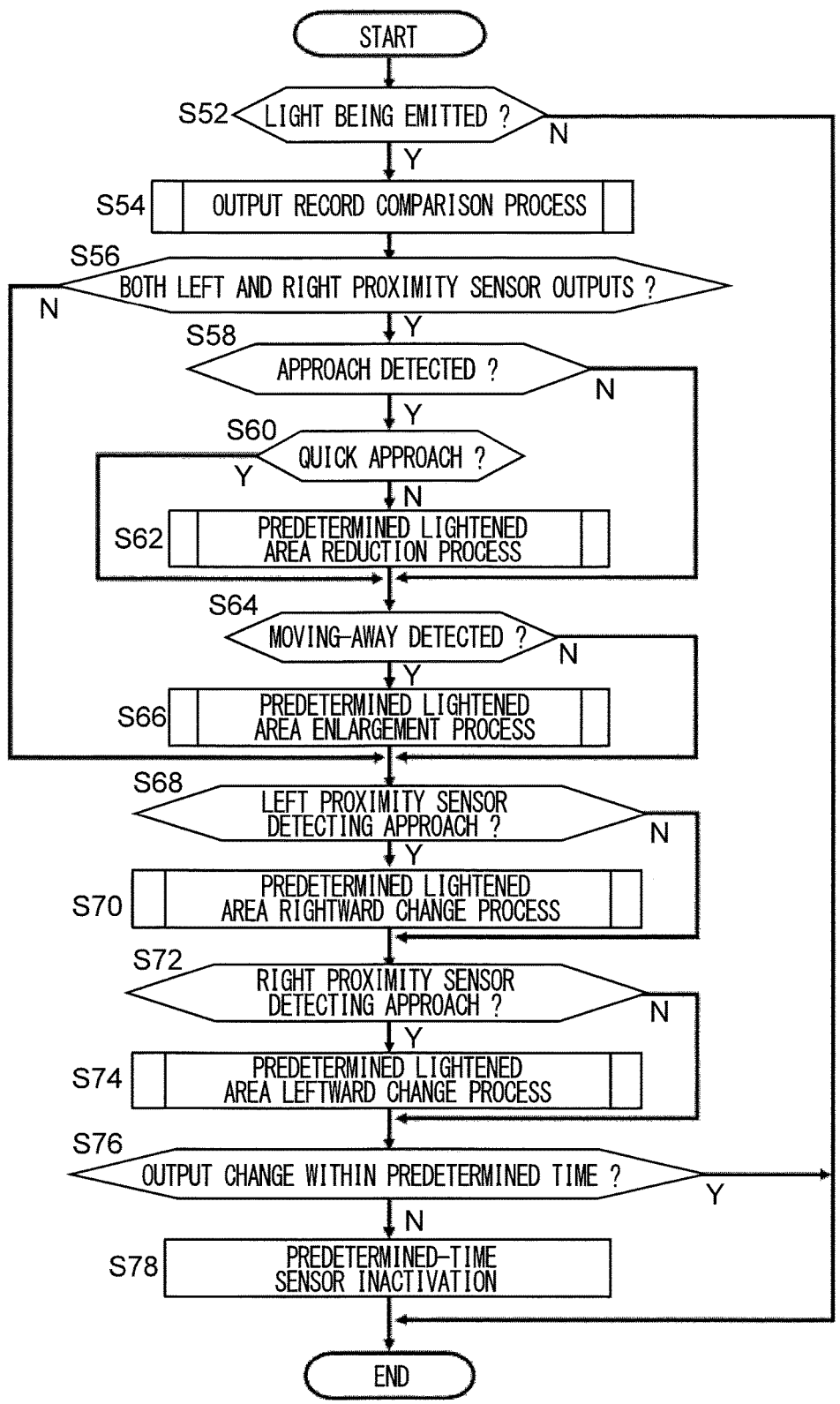
FIG. 11 is a flow chart showing details of a step S38 in FIG. 10.

FIG. 11 is a flow chart showing details of the lit area change process in the step S38 in FIG. 10. If the flow starts, in a step S52, it is checked whether or not light emission is ongoing. And, if light emission is not ongoing, the flow is immediately ended. In this way, if light emission is not ongoing, the outputs from the left proximity sensor and the right proximity sensor become invalid and nothing is performed. This is because the lit area change is meaningless if the lit area change is performed without confirming the kitchen utensils and the like that are actually illuminated with light emission.

If it is detected in the step S52 that light emission is ongoing, the flow goes to a step S54 to perform the same output record comparison process as in the step S18 in FIG. 10 and goes to a step S56. In the step S56, it is checked whether or not there are sensor outputs from both of the left proximity sensor and the right proximity sensor. And, if there are both sensor outputs, the flow goes to a step S58 to check whether or not it is an approach detection. And, if it is an approach detection, the flow goes to a step S60 to check whether or not it is a quick approach. If it is not a quick approach, a the flow executes predetermined lit area reduction process in a step S62 and goes to a step S64. On the other hand, if a quick approach is detected in the step S60, the flow directly goes to the step S64, Besides, in a case as well where an approach detection is not performed in the step S58, the flow directly goes to the step S64. In this way, the lit area reduction operation in the step S62 is executed only when both hands are made to slowly approach the left proximity sensor and the right proximity sensor.

In the step S64, it is checked whether or a moving-away is detected based on the sensor outputs from both of the left proximity sensor and the right proximity sensor. And, if it is a moving-away detection, the flow executes a predetermined lit area enlargement process in a step S66 and goes to a step S68. On the other hand, if a moving-away detection is not performed in the step S64, the flow directly goes to the step S68. In this way, the lit area enlargement process in the step S66 is executed irrespective of the speed of both hands moving away from the left proximity sensor and the right proximity sensor. Here, in a case as well where it is not detected that there are sensor outputs from both of the left proximity sensor and the right proximity sensor, the flow directly goes to the step S68.

In the step S68, it is checked whether or not an approach detection is performed based on the sensor output from the left proximity sensor. And, if there is an approach detection, the flow executes a predetermined lit area rightward change process in a step S70 and goes to a step S72. On the other hand, when in the step S68, there is not an approach detection based on the sensor output from the left proximity sensor, the flow directly goes to the step S72.

In the step S72, it is checked whether or not an approach detection is performed based on the sensor output from the right proximity sensor. And, if there is an approach detection, the flow executes a predetermined lit area leftward change process in a step S74 and goes to a step S76. On the other hand, when in the step S72, there is not an approach detection based on the sensor output from the right proximity sensor, the flow directly goes to the step S76. As described above, when there is the sensor output only from either one of the left proximity sensor and the right proximity sensor, an approach detection is performed at all times; and even if there is a moving-away detection, nothing is performed. The reason for this is that because the left proximity sensor and the right proximity sensor are in charge of one and the other of the left-right movements, respectively, it is not necessary to perform both-direction detections. Besides, by employing such detection method, there is no risk that an erroneous operation occurs because of a moving-away. Here, such detection method approximates, in a non-contact fashion, a hand movement that for example pushes a swing type of lighting apparatus rightward with the left hand or leftward with the right hand; and allows operation with the same operation sense as if directly touching the lighting apparatus even when not touching directly the lighting apparatus.

In the step S76, it is checked whether or not an output change occurs within a predetermined time in either one of the left proximity sensor and the right proximity sensor. This is a step that has the same meaning as the step S32 in FIG. 10. In other words, if both hands that cause output changes from both of the left proximity sensor and the right proximity sensor still move thereafter, an output change occurs within the predetermined time; however, thereafter, it both hands are stopped, an output change does not occur. And, if it is detected that both hands continue to be stopped and there is not an output change within the predetermined time, the flow goes to a step S78; thereafter, during a predetermined time, inactivates the proximity sensors. This is to prevent the proximity sensor from: detecting a moving-away movement of the hand after the hand, which performs the lit area change, achieves a predetermined lit area change; and causing an erroneous operation that generates an unintentional lit area enlargement. If the predetermined time elapses in the step S78, the flow ends. On the other hand, if there is an output change within the predetermined time in the step S76, it is considered that the lit area change operation continues and the flow is ended.

As described hereinafter, with a slight replacement, it is also possible to apply the flow charts in FIGS. 10 and 11 to Embodiments 1 and 2. First, when the color change function is not employed like Embodiments 1, 2, the "night light yellow turning-on" in the step S4 and the step S42 in FIG. 10 is replaced with the "night light turning-on." Besides, the step S28 and the step S30 are omitted. On the other hand, although not replacement, the "lit area change process" in the step S38 in FIG. 10 and the "lit area reduction and enlargement" or the "lit area left-right change" in the steps S62, S66, S70 and S74 in FIG. 11 are not limited to the lighting apparatuses that perform the processes by means of the mechanical drive portion in Embodiment 3 and Embodiment 4; and are applicable to the lighting apparatuses that perform the processes by means of the turning-on target LED group change and the brightness change of the turning-on target LED group as in Embodiment 1 and Embodiment 2.

The practical application of the various features of the present invention which are exemplified in the above respective Embodiments is not limited to the Embodiments as they are. For example, in a case where the pair of the left proximity sensor and the right proximity sensor that are in charge of detecting the hand movements which are in directions opposite to each other are disposed and the control of the light source portion is performed based on the respective left-hand and right-hand movements of which the pair of left proximity sensor and right proximity sensor are in charge, in the step S68 and the step S72 of the flow chart in FIG. 11, the proximity sensors each perform only the hand-approach detection; and are inactivated for the moving-away, so that an operation-sensuous confusion does not occur between the hand movement and the lit area change obtained as a result of the hand movement. However, the application, in which the pair of the sensors in charge of detecting the hand movements in directions opposite to each other, is not limited to this. As an example, a structure may be employed, in which the left proximity sensor and the right proximity sensor detect some hand movement; irrespective of a detailed condition of the hand movement, if the hand movement is a left-hand movement, the step S70 is performed, while if the hand movement is a right-hand movement, the step S74 is performed. According to this structure, for example, a reciprocating movement of the left hand generates a rightward change of the lit area while a reciprocating movement of the right hand generates a leftward change of the lit area. In this case as well, by learning the operation and the result of the operation, it becomes possible for the operator to perform the rightward change or the leftward change of the lit area having a sense as if the operator is repeating the left-hand or right-hand approach movement.

Figure 12:
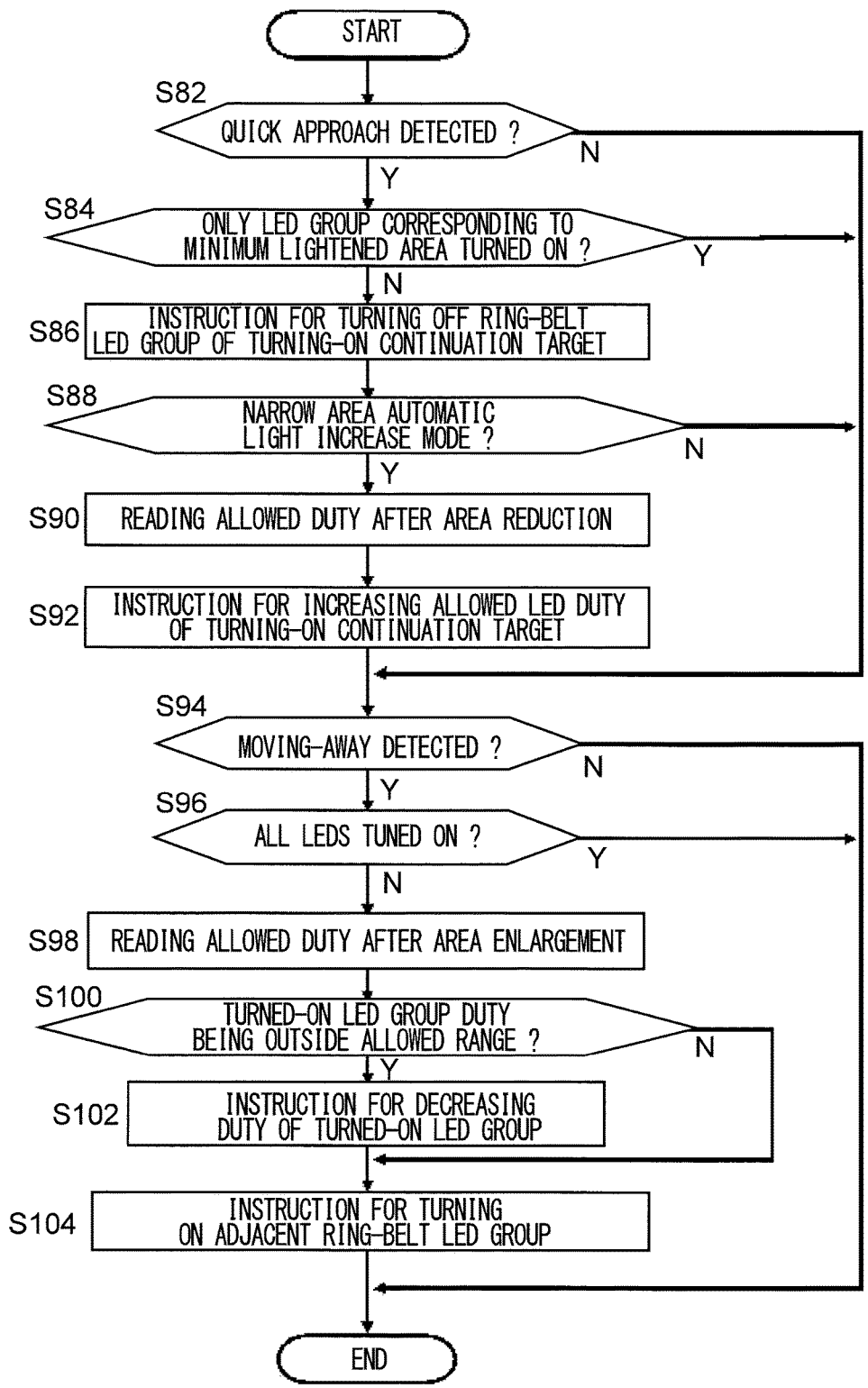
FIG. 12 is a flow chart that shows details of a step S62 and a step S66 in FIG. 11 and is used for control in Embodiment 1 and Embodiment 2.

FIG. 12 is a flow chart that shows details of the predetermined lit area reduction process in the step S62 in FIG. 11 and of the predetermined lit area enlargement process in the step S66 in FIG. 11. The flow chart in FIG. 12 is used for an example of the type in which the lit area is changed in accordance with the increase and decrease of the number of turned-on LED groups as in Embodiment 1 in FIG. 1 and Embodiment 2 in FIG. 6; and is so structured as to be applicable to both of the step S62 and the step S66. If the flow starts, the flow goes to a step S82 to check whether or not the detected movement is a quick approach. If it is a quick approach, the flow goes to a step S84 to check whether or not only the LED group corresponding to the minimum lit area is now in the turned-on state. If it is not true, the flow goes to a step S86 to issue an instruction for turning off an LED group corresponding to a ring belt adjacent to a turning-on continuation target and reduces the lit area.

Next, it is checked in a step S88 whether or not it is a mode for automatically increasing the brightness of an LED group which continues to be turned on when the lit area is narrowed. If it is confirmed in the step S88 that it is such a narrow area automatic light increase mode, the flow goes to a step S90 to read, from a storage portion in the control portion, data of a duty cycle that is allowed after the lit area reduction. And, in a step S92, the flow issues an instruction for increasing the duty cycle of the LED group of the turning-on continuation target within the allowed range that is read in the step S90; and goes to a step S94. On the other hand, if a quick approach detection is not confirmed in the step S82, or if the LED group only corresponding to the minimum lit area is in the turned-on state in the step S84 and it is impossible to reduce the lit area any more, or if the narrow area automatic light increase mode is not confirmed in the step S88, the flow directly goes to the step S94.

In the step S94, it is checked whether or not the detected movement is a moving-away. If it is a moving-away detection, the flow goes to a step S96 to check whether or not all the LED groups are now in the turned-on state. If it is not true, the flow goes to a step S98 to read, from the storage portion in the control portion, data of a duty cycle that is allowed after the lit area enlargement. And, in a step S100, it is check whether or not the duty cycle of an LED group that is in the turned-on state falls outside the allowed range that is read in the step S98. And, if it is true, the flow goes to a step S102 to issue an instruction for decreasing the duty cycle of the LED group that is in the turned-on state; and goes to a step S104. Besides, if it is confirmed that the duty cycle of the LED group which is already in the turned-on state does not fall outside the allowed range even if turned-on LEDs are increased, the flow directly goes to the step S104.

In the step S104, an instruction is issued for turning on the LED group corresponding to the ring belt adjacent to the turning-on continuation target to enlarge the lit area and the flow is ended. On the other hand, if a moving-away is not confirmed in the step S94, or if all the LED groups are in the turned-on state in the step S96 and it is impossible to enlarge the lit area any more, the flow is immediately ended.

Figure 13:
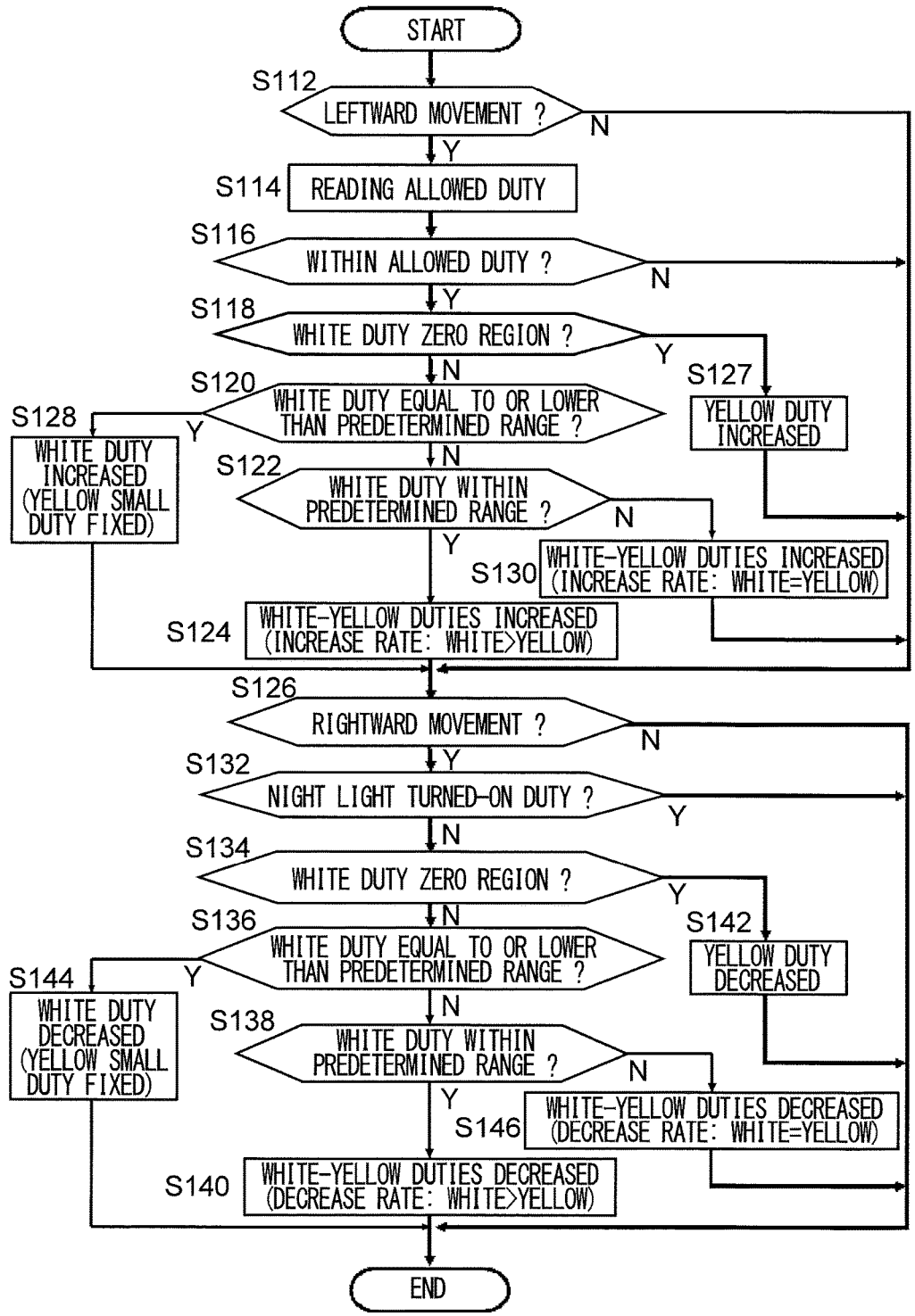
FIG. 13 is a flow chart that shows details of a step S26 in FIG. 10 and is used for control in Embodiment 3 and Embodiment 4.

FIG. 13 is a flow chart that shows details of the predetermined light amount change process in the step S26 in FIG. 10. The flow chart in FIG. 13 is used for an example of the type in which the white light LEDs and the yellow light LEDs are mingled as in Embodiment 3 in FIG. 8 and Embodiment 4 in FIG. 9 whereby it is possible to adjust the lighting color; and is used to automatically lower the color temperature to obtain a lighting color in which a yellowish color prevails if the light amount becomes small. If the flow starts, in a step S112, it is checked whether or not the detected movement is a left-ward movement. If it is a leftward movement detection, the flow goes to a step S114 to read, from the storage portion in the control portion, data of the allowed duty cycle in the current turned-on state. And, in the next step S116, it is checked whether or not the turning-on is performed within the allowed duty cycle; if it is within the allowed duty cycle, there is room for further raising the duty cycle to increase the light amount, accordingly the flow goes to a step S118.

In the step S118, it is checked whether or not the light amount is at a low level, only the yellow light LED group is in the turned-on state, and the duty cycle of the white light LED group is in a zero region. If it is not such a region, the flow goes to a step S120 to check whether or not the duty cycle of the white light LED group is equal to or under a lower limit of a predetermined range. If it is not in such a range, the flow goes to a step S122 to check whether or not the duty cycle of the white light LED group is in the predetermined range. And, if it is in this range, in a step S124, the flow issues an instruction for enlarging the duty cycles of the white light LED group and the yellow light LED group to increase the illumination light amount by a predetermined amount; and goes to a step S126. Here, the duty cycle increase rate of the white light LED group is made larger than that of the yellow light LED group such that the total brightness increases, the tint shifts toward the white and the color temperature rises.

On the other hand, if it is not confirmed that the movement detected in the step S112 is a leftward movement, the flow goes to the step S126. Besides, in the step S116, if it is confirmed that the current duty cycle already reaches the allowed limit and there is no room for increasing the light amount any more, the flow directly goes to the step S116. Further, in the step S118, if it is confirmed that the duty cycle of the white light LED group is in the zero region, the flow goes to the step S127 to increase the duty cycle of the yellow light LED group by a predetermined amount; and goes to the step S126. In other words, in this region, the white light LED group is not turned on yet and the brightness of the yellow light LED group is increased.

Besides, in the step S120, if it is confirmed that the white light LED group is in a region to be turned on; however, its duty cycle is equal to or under than the lower limit of the predetermined range, the flow goes to a step S128 to fix the duty cycle of the yellow light LED group at a small duty cycle at a time the white light LED group reaches the turned-on region and to increase the duty cycle of the white light LED group only by a predetermined amount. According to this, the total brightness increases, the tint shifts toward the white and the color temperature rises. Further, in the step S122, if it is not confirmed that the duty cycle of the white light LED group is in the predetermined range, this means that the duty cycle is equal to or over the upper limit of the predetermined range; accordingly, the flow goes to a step S130 to increase the duty cycles of both of the white light LED group and the yellow light LED group by a predetermined amount at the same increase rate; and goes to the step S126. In the region where the step S130 is executed, the color temperature is already at the upper limit and only the brightness is increased with the same color temperature kept. Here, this step S130 is so structured as to preferentially increase the brightness to the limit of the allowed duty cycle. However, in a case where the color temperature is further preferentially raised in accordance with the brightness increase, in the step S130, a structure may be employed, in which the duty cycle of the yellow light LED group is fixed at a relatively large duty cycle at a time the white light LED group reaches the turned-on predetermined range upper limit and only the duty cycle of the white light LED group only is increased by a predetermined amount.

In the step S126, it is checked whether or not the movement detected in the step S24 in FIG. 10 is a rightward movement. If it is a rightward movement detection, the flow goes to a step S132 to check whether or not the current lighting is performed at the night light lighting duty cycle for the minimum brightness; if it is not true, there is room for further making the duty cycle smaller to decrease the light amount; accordingly the flow goes to a step S134.

In the step S134, it is checked whether or not the light amount is at a low level, only the yellow light LED group is in the turned-on state, and the duty cycle of the white light LED group is in the zero region. If it is not such a region, the flow goes to a step S136 to check whether or not the duty cycle of the white light LED group is equal to or under the lower limit of a predetermined range. If it is not in such a range, the flow goes to a step S138 to check whether or not the duty cycle of the white light LED group is in the predetermined range. And, if it is in this range, in a step S140, the flow issues an instruction for making the duty cycles of the white light LED group and the yellow light LED group small and decreasing the illumination light amount by a predetermined amount; and the flow is ended. Here, the duty cycle decrease rate of the white light LED group is made larger than that of the yellow light LED group such that the total brightness decreases, the tint shifts toward the yellow and the color temperature becomes low.

On the other hand, if it is not confirmed that the movement detected in the step S126 is a rightward movement, the flow is immediately ended. Besides, in the step S132, if it is confirmed that the current duty cycle is already in the night light turned-on state and there is no room for decreasing the light amount to lower the light amount any further, the flow is immediately ended. Further, in the step S134, if it is confirmed that the duty cycle of the white light LED group is in the zero region, the flow goes to a step S142 to decrease the duty cycle of the yellow light LED group by a predetermined amount; and the flow is ended. In other words, in this region, the white light LED group is not in the turned-on state and the brightness of the yellow light LED group is decreased.

Besides, in the step S136, if it is confirmed that the white light LED group is in a region to be turned on; however, its duty cycle is equal to or under than the lower limit of a predetermined range, the flow goes to a step S144 to fix the duty cycle of the yellow light LED group at a small duty cycle at the lower limit of the white light LED group turned-on region and to decrease the duty cycle of the white light LED group only by a predetermined amount. According to this, the total brightness decreases, the tint shifts toward the yellow and the color temperature becomes low. Further, in the step S138, if it is not confirmed that the duty cycle of the white light LED group is in the predetermined range, this means that the duty cycle is equal to or over the upper limit of the predetermined range; accordingly, the flow goes to a step S146 to decrease the duty cycles of both of the white light LED group and the yellow light LED group by a predetermined amount at the same decrease rate. The color temperature in this region is already at the upper limit and only the brightness is decreased with the same color temperature kept. Here, the structure of this step S146 is a structure in which the brightness is preferentially increased to the limit of the allowed duty cycle like in the step S130. However, in a case where the color temperature is further preferentially lowered in accordance with the brightness decrease in the same way as described in the step S130, in the step S146, a structure may be employed, in which the duty cycle of the yellow light LED group is fixed at a relatively large duty cycle at a time the white light LED reaches the turned-on predetermined range upper limit and only the duty cycle of the white light LED group only is decreased by a predetermined amount. Here, a relationship between the brightness and the color temperature, which is used for the above control, is recorded as a table in the storage portion of the control portion 40.

Figure 14:
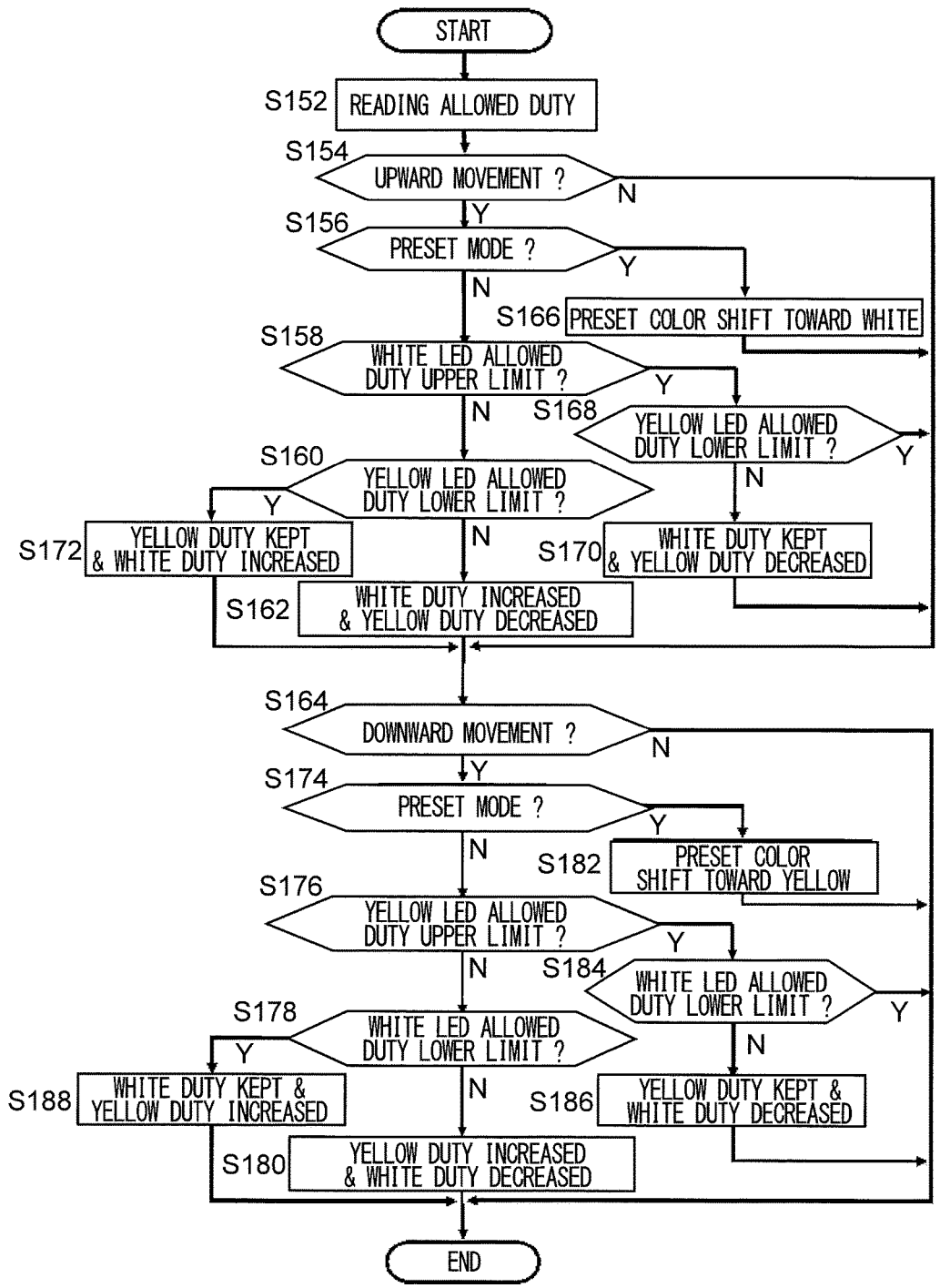
FIG. 14 is a flow chart that shows details of a step S30 in FIG. 10 and is used for the control in Embodiment 3 and Embodiment 4.

FIG. 14 is a flow chart that shows details of the predetermined color change process in the step S30 in FIG. 10. The flow chart in FIG. 14 is also used for an example of the type in which the white light LEDs and the yellow light LEDs are mingled as in Embodiment 3 in FIG. 8 and Embodiment 4 in FIG. 9 whereby it is possible to adjust the lighting color. If the flow starts, in a step S152, data of the allowed duty cycle in the current turned-on state are read from the storage portion of the control portion. Next, the flow goes to a step S154, where it is it is checked whether or not the movement detected in the step S28 in FIG. 10 is an upward movement. If it is an upward movement detection, the flow goes to a step S156 to check whether or not a preset mode for a predetermined color is set. It is possible to perform this mode setting in advance in the step S2 in FIG. 10.

If it is not a preset mode, the flow goes to a step S158 to check whether or not the white light LED group is turned on at the duty cycle upper limit of the allowed range; if it is not the allowed duty cycle upper limit, there is room for further increasing the duty cycle of the white light LED group to raise the color temperature; accordingly, the flow goes to a step S160. In the step S160, it is checked whether or not the yellow light LED group is turned on at the duty cycle lower limit of the allowed range; if it is not the allowed duty cycle lower limit, there is room for further decreasing the duty cycle of the yellow light LED group to raise the color temperature; accordingly, the flow goes to a step S162. In the step S162, the duty cycle of the white light LED group is increased by a predetermined amount and the duty cycle of the yellow light LED group is decreased by a predetermined amount, whereby the color temperature is raised and the flow goes to a step S164.

On the other hand, if an upward movement is not confirmed in the step S154, the flow directly goes to the step S164. Besides, if a preset mode setting is confirmed in the step S156, the flow goes to a step S166 to shift the color temperature by one step to a preset color on the white side by changing the duty cycles of the white light LED group and the yellow light LED group to a value set in advance; thereafter, goes to the step S164. Here, in a case where only two colors are set as the preset colors, the color temperature is set at the preset color on the white side.

Besides, in the step S158, if it is detected that the white light LED group is turned on at the duty cycle upper limit of the allowed range, the flow goes to a step S168 to further check whether or not the yellow light LED group is turned on at the duty cycle lower limit of the allowed range. If it is not true, the flow goes to a step S170 to raise the color temperature by decreasing the duty cycle of the yellow light LED group by a predetermined amount while keeping the duty cycle of the white light LED group at the upper limit; and goes to the step S164. On the other hand, in the step S168, in a case where it is detected that the yellow light LED group is turned on at the duty cycle lower limit of the allowed range, the color temperature is already at the maximum value of the adjustable range and there is no room for further raising; accordingly, the flow directly goes to the step S164.

Besides, in the step S160, in a case where it is detected that the yellow light LED group is turned on at the duty cycle lower limit of the allowed range, the flow goes to a step S172 to raise the color temperature by increasing the duty cycle of the white light LED group by a predetermined amount while keeping the duty cycle of the yellow light LED group at the lower limit; and goes to the step S164.

In the step S164, it is checked whether or not the movement detected in the step S28 in FIG. 10 is a downward movement. If it is a downward movement detection, the flow goes to a step S174 to check whether or not a preset mode for a predetermined color is set. If it is not a preset mode, the flow goes to a step S176 to check whether or not the yellow light LED group is turned on at the duty cycle upper limit of the allowed range; if it is not the allowed duty cycle upper limit, there is room for further increasing the duty cycle of the yellow light LED group to decrease the color temperature; accordingly, the flow goes to a step S178. In the step S178, it is checked whether or not the white light LED group is turned on at the duty cycle lower limit of the allowed range; if it is not the allowed duty cycle lower limit, there is room for decreasing the color temperature by decreasing the duty cycle of the white light LED group; accordingly, the flow goes to a step S180. And, in the step S180, the duty cycle of the yellow light LED group is increased by a predetermined amount and the duty cycle of the white light LED group is decreased by a predetermined amount, whereby the color temperature is lowered and the flow is ended.

On the other hand, if a downward movement is not confirmed in the step S164, the flow is ended. Besides, if a preset mode setting is detected in the step S174, the flow goes to a step S182 to shift the color temperature by one step to a yellow-side preset color by changing the duty cycles of the white light LED group and the yellow light LED group to a value set in advance; thereafter, the flow is ended. Here, in a case where only two colors are set as the preset colors, the color temperature is set at the yellow side preset color.

Besides, in the step S176, if it is detected that the yellow light LED group is turned on at the duty cycle upper limit of the allowed range, the flow goes to a step S184 to further check whether or not the white light LED group is turned on at the duty cycle lower limit of the allowed range. And, if it is not true, the flow goes to a step S186 to lower the color temperature by decreasing the duty cycle of the white light LED group by a predetermined amount while keeping the duty cycle of the yellow light LED group at the upper limit; and the flow is ended. On the other hand, in the step S184, in a case where it is detected that the white light LED group is turned on at the duty cycle lower limit of the allowed range, the color temperature is already at the minimum value of the adjustable range and there is no room for further lowering; accordingly, the flow is immediately ended.

Besides, in the step S178, in a case where it is detected that the white light LED group is turned on at the duty cycle lower limit of the allowed range, the flow goes to a step S188 to lower the color temperature by increasing the duty cycle of the yellow light LED group by a predetermined amount while keeping the duty cycle of the white light LED group at the lower limit; and the flow is ended.

The use of the above various advantages of the present invention is not limited to the above Embodiments: the use is able to find its way into other various practical applications. For example, in Embodiments in FIG. 6 and FIG. 7, to dispose the light emitting diode groups not on a planar surface but three-dimensionally, the inward bent surface which is part of the sphere is used. However, as already described, to dispose the LED groups such that the light emission center axes are not parallel to each other, the disposition on a simple spherical surface is not limiting: it is possible to minutely perform the design considering the illuminance of a lit target surface. Besides, as for the base for the disposition, it is possible to use not only an inward bent surface but also an outward bent surface. Further, it is possible to use a three-dimensional disposition deviated in a stepwise fashion instead of a continuous surface.

<Sum Up>

Hereinafter, the various technological features disclosed in the present specification are summed up.

<First Technological Feature>

Of the various technological features disclosed in the present specification, an object of a first technological feature is to provide a lighting apparatus that has a useful function and is easy to control.

To achieve the object, the first technological feature disclosed in the present specification provides a lighting apparatus that includes: a light source portion for lighting; a non-contact proximity sensor that is disposed at a position for detecting a hand movement outside a lit area provided by the light source portion; and a control portion that during lighting by the light source portion, controls the light source portion based on an output from the non-contact proximity sensor. According to this, it becomes possible to control the light source portion during the lighting without allowing a hand, which operates the non-contact proximity sensor, to cast a shadow onto a lit target. Here, the control of the light source portion by the control portion includes lit area changes such as a lit spread change, a lit position movement and the like.

According to a specific feature, the light source portion includes a plurality of light emitting diodes; the control portion selectively controls the plurality of light emitting diodes. According to this, it becomes possible to selectively control the plurality of light emitting diodes without allowing the hand, which operates the non-contact proximity sensor, to cast a shadow onto the lit target. According to the selective control of the plurality of light emitting diodes, it becomes possible to change the lit area, for example.

According to another specific feature, the control portion changes the lit area provided by the light source portion in a direction in accordance with the hand movement that is detected by the non-contact proximity sensor. According to this, despite the non-contact operation, it is possible to take over a familiar operation way as if changing the lit area by pushing the lighting apparatus by hand.

Another feature provides a lighting apparatus that includes: a light source portion for lighting; a non-contact proximity sensor that detects a hand movement; and a control portion that controls the light source portion based on an output from the non-contact proximity sensor in accordance with determination criteria that are different when the light source portion is lighting versus when the light source portion is not lighting. According to this, it is possible to execute the lighting operation that requires relatively many control items by minutely determining the output from the non-contact proximity sensor and to perform, based on a detection result irrespective of the output from the non-contact proximity sensor, the control during a time of not-lighting that requires relatively less control items.

According to a specific feature, the control portion controls the light source portion in a first way based on a first output change from the non-contact proximity sensor when the light source portion is lighting; and controls the light source portion in a second way based on a second output change from the non-contact proximity sensor; on the other hand, when the light source portion is not lighting, the control portion puts the light source portion into the lighting state even if the output change from the non-contact proximity sensor is the first output change or the second output change. According to this, it is possible to surely perform directional control for increasing or decreasing the brightness during the lighting by changing the hand movement; and easily achieve a simple purpose of turning on the light source portion by means of any hand movement when the light source portion is not lighting. Here, in the above description, both of a turned-off state and a night light turned-on state are the non-lighting states.

Another feature provides a lighting apparatus that includes: a light source portion for lighting; a non-contact proximity sensor that detects a hand movement; and a control portion that controls the light source portion based on an output from the non-contact proximity sensor; and in a time zone adjacent to this control, does not perform control based on the output from the non-contact proximity sensor. According to this, it is possible to prevent an unintentional erroneous operation based on a hand movement in the time zone that is adjacent to the control of the light source portion.

According to a specific feature, the adjacent time zone is a time zone before the light source portion is controlled based on the output from the non-contact proximity sensor. According to this, for example, in a case where desired control of the light source portion is performed based a moving-away movement from the non-contact proximity sensor, it is possible to prevent an unintentional erroneous operation when the hand is made to approach the non-contact proximity sensor before performing the control. Besides, according to another specific feature, the adjacent time zone is a time zone after the light source portion is controlled based on the output from the non-contact proximity sensor. According to this, for example, when the desired control of the light source portion is completed and the hand is made to move away, it is possible to prevent an unintentional erroneous operation from occurring.

Another feature provides a lighting apparatus that includes: a light source portion for lighting; a non-contact proximity sensor that detects a hand movement; and a control portion that controls the light source portion based on an output from the non-contact proximity sensor; and does not perform control based on a predetermined output change from the non-contact proximity sensor. According to this, it is possible to prevent an unintentional erroneous operation based on a hand movement that is not for a target operation.

According to a specific feature, the predetermined output change is an output change faster than predetermined. According to this, when minute adjustment control is performed based on a slow hand movement, it is possible to prevent an unintentional erroneous operation caused by a hand movement that first quickly approaches the non-contact proximity sensor for this operation.

Another feature provides a lighting apparatus that includes: a light source portion for lighting; a non-contact proximity sensor that includes a pair of sensor portions that are in charge of detecting hand movements which are in directions opposite to each other; and a control portion that controls the light source portion based on respective hand movements of which the pair of sensor portions are in charge. According to this, despite an operation that is able to perform bidirectional control, it is sufficient for each sensor to detect only one-directional movement, so that it is possible to prevent an erroneous operation caused by an unintentional opposite-directional movement.

According to a specific feature, the pair of sensor portions are disposed in directions opposite to each other; and the control portion controls the light source portion based on the respective hand approach detections by the pair of sensor portions. According to this, despite the non-contact operation, it is possible to take over a familiar operation way as if adjusting the lit area and the like by pushing the lighting apparatus in opposite directions by the right hand or the left hand.

Another feature provides a lighting apparatus that includes: a light source portion for lighting; a non-contact proximity sensor that detects a hand movement; and a control portion that controls the light source portion based on an output from the non-contact proximity sensor, and performs specific control based on a specific output change from the non-contact proximity sensor during a specific time from an output change start of the non-contact proximity sensor. According to this, a specific hand movement at an operation start time is not mistaken as another movement.

According to a specific feature, the specific output change is an output change faster than predetermined. According to this, it is possible to perform a simple operation, which is not aimed at minute adjustment such, for example, as ending the lighting state and the like, without allowing a fast hand movement to be mistaken as another operation.

As described above, according to the first technological feature disclosed in the present specification, it is possible to provide a lighting apparatus that has useful functions and is easy to control.

<Second Technological Feature>

Of the various technological features disclosed in the present specification, an object of a second technological feature is to provide a lighting apparatus that has a useful function.

To achieve the object, the second technological feature disclosed in the present specification provides a lighting apparatus that includes: a light source portion that includes a plurality of light emitting diodes; a power-supply portion that supplies electricity to the light source portion; and a control portion that controls the number of actually turned-on diodes of the plurality of light emitting diodes, and increases allowed electricity suppliable to each light emitting diode that is in an actual turned-on state when limiting the number of light emitting diodes that are in the actual turned-on state.

According the above feature, it is possible to achieve a preferred relationship between the number of light emitting diodes in the actual turned-on state and the electricity supplied to each light emitting diode. Here, adjustment of the electricity supply is possible by means of changes of an electric-current amount supplied to the light emitting diode and of the duty cycle.

According to a specific feature, the light source portion has a heat radiation portion for the light emitting diode; and the allowed electricity is decided in accordance with a heat radiation capability of the heat radiation portion. According to this, for example, when the number of light emitting diodes in the actual turned-on state is limited, part of the heat radiation capability of the heat radiation portion is reserved, so that by making use of this, it is possible to increase the electricity supply to each light emitting diode and achieve efficient light emission.

According to another specific feature, the light source portion changes the number of light emitting diodes that are in the actual turned-on state, thereby changing the spread of the lit area. For example, the light source portion limits the number of light emitting diodes that are in the actual turned-on state, thereby narrowing the lit area. In this case, when the lit area is narrowed, the allowed electricity suppliable to each light emitting diode is increased, so that it becomes possible to light the spot-like narrow lit area more brightly.

Another feature provides a lighting apparatus that includes: a light source portion that includes a plurality of light emitting diodes; a power-supply portion that supplies electricity to the light source portion; and a control portion that controls the number of actually turned-on diodes of the plurality of light emitting diodes to change a spread of a lit area. According to this, it becomes possible to change the spread of the lit area even without a movable portion. However, a movable portion is not discouraged from being used together.

According to a specific feature, the control portion limits the number of light emitting diodes that are in the actual turned-on state, thereby increasing the electricity supplied to each light emitting diode that is in the actual turned-on state when the lit area is narrowed. According to this, it becomes possible to light the spot-like narrow lit area more brightly. According to this, for example, as in a case where the lit area is lightened more brightly when the lit area is made small by an optical system, even in a lit area change by a movable portion, it is possible to provide a familiar lighting condition in a pseudo-fashion.

According to a specific feature, by disposing three-dimensionally the plurality of light emitting diodes, the lit area by each light emitting diode is decided. More specifically, the plurality of light emitting diodes are disposed on a planar-shape flexible board to bend the diodes as a whole, whereby the plurality of light emitting diodes are three-dimensionally disposed. According to this, by using individual light emitting diodes that have a relatively lighting area, it becomes possible to decide a preferred lighting area even without a light collection means and a movable portion. However, a light collection means and a movable portion are not discouraged from being used together.

Another feature provides a lighting apparatus that includes: a light source portion that includes a plurality of light emitting diodes; a power-supply portion that supplies electricity to the light source portion; and a control portion that controls an actual lighting state of the plurality of light emitting diodes, changes a light emitting diode that is in the actual lighting state and thereby shifts a lit area. According to this, it becomes possible to shift the lit area even without a movable portion. However, a movable portion is not discouraged from being used together.

Another feature provides a lighting apparatus that includes: a light source portion that includes a light emitting diode; a power-supply portion that supplies electricity to the light source portion; and a control portion that changes a brightness of the light source portion, and automatically makes a color temperature of the light source portion change in accordance with the brightness change.

According to the above feature, for example, it is possible to provide in a pseudo-fashion: for example, a relationship between electricity supply to a filament of an incandescent lamp and a familiar lighting condition such as a color temperature change of the sun during day time and at dusk and the like. According to a more specific feature example, it is possible to turn on the light source portion as a night light by means of the minimum brightness and the lowest color temperature; according to this, it is possible to suppress an uncomfortable feeling of darkening the lighting while keeping the color temperature high.

Another feature provides a lighting apparatus that includes: a light source portion that includes a light emitting diode; a power-supply portion that supplies electricity to the light source portion; and a control portion that changes a color temperature of the light source portion; and a storage portion that stores the color temperature controlled by the control portion. According to this, in various situations, it becomes easy to restore a once set preferred color temperature and to control a preferred color temperature in accordance with the brightness.

Another feature provides a lighting apparatus that includes: a light source portion that includes a plurality of kinds of light emitting diodes that have different color temperatures; a power-supply portion that supplies electricity to the light source portion; and a control portion that changes a lighting color temperature as a whole by selecting a light emitting diode, and based on a relationship between a brightness and a color temperature, applies different control to the plurality of kinds of light emitting diodes. According to this, it is possible to flexibly achieve a color temperature change in various situations.

According to the above specific feature, for example, the control portion changes the electricity supply to, of the plurality of kinds of light emitting diodes, a light emitting diode that has a high color temperature, thereby changing the lighting color temperature as a whole. Besides, according to another specific example, the control portion changes the electricity supply to, of the plurality of kinds of light emitting diodes, a light emitting diode that has a low color temperature, thereby changing the lighting color temperature as a whole. Further, according to another specific example, the control portion changes the respective electricity supply to the plurality of kinds of light emitting diodes, thereby changing the lighting color temperature as a whole.

As described above, according to the second technological feature disclosed in the present specification, it is possible to provide a lighting apparatus that has useful functions.

INDUSTRIAL APPLICABILITY

The various technological features disclosed in the present specification are applicable to lighting apparatuses in various living environments such as a kitchen, a bathroom and the like.

OTHER MODIFICATIONS

Here, in the above description, the best embodiments are described; however, the disclosed technological features are modifiable in various ways; besides, it is possible to employ various embodiments different from the structures that are specifically employed in the above description, which is apparent to those skilled in the art. Accordingly, the following claims are intended to cover any modifications of the present invention in the technological scope without departing from the spirit and technological concept of the present invention.

LIST OF REFERENCE NUMERALS 6, 106, 207, 208, 307, 308 light source portions
32, 132, 232, 233, 332, 333 power-supply portions
40, 140, 240, 340 control portions
42 to 46, 142 to 146, 242 to 246 non-contact proximity sensors
44, 46, 144, 146, 244, 246, 344, 346 pairs of sensor portions

The invention claimed is:

1. A lighting apparatus for use with a plurality of light emitting diodes comprising:
   a heat radiator having a bent surface; and
   a flexible board for mounting the plurality of light emitting diodes,
   wherein the flexible board is attached on the bent surface so that the plurality of light emitting diodes are disposed on a bent plane corresponding the bent surface of the heat radiator and that the plurality of light emitting diodes are cooled commonly by the heat radiator,
   wherein the flexible board includes cutout pieces radially extending from the center of the flexible board, the lighting apparatus further comprising a driver circuit located at the center of the flexible board for driving the plurality of light emitting diodes.

2. The lighting apparatus according to claim 1, wherein light emission center axes of the plurality of light emitting diodes are not parallel to each other.

3. The lighting apparatus according to claim 2, wherein the light emission center axes of the plurality of light emitting diodes concentrate.

4. The lighting apparatus according to claim 1, wherein the bent surface of the heat radiator is inwardly bent.

5. The lighting apparatus according to claim 1, wherein the bent plane on which the plurality of light emitting diodes are disposed is a part of a spherical surface.

6. The lighting apparatus according to claim 1, wherein the driver circuit is radially connected to the plurality of light emitting diodes mounted on each of the cutout pieces, respectively, without cut by discontinuity between the cutout pieces.

7. A lighting apparatus for use with a plurality of light emitting diodes comprising:
   a heat radiator having a bent surface; and
   a flexible board for mounting the plurality of light emitting diodes,
   wherein the flexible board is attached on the bent surface so that the plurality of light emitting diodes are disposed on a bent plane corresponding the bent surface of the heat radiator and that the plurality of light emitting diodes are cooled commonly by the heat radiator,
   wherein the flexible board includes cutout pieces radially extending from the center of the flexible board so that the cutout pieces are in contact with each other with the flexible board attached on the bent surface of the radiator.

8. A lighting apparatus for use with a plurality of light emitting diodes comprising:
   a flexible board including cutout pieces radially extending from the center of the flexible board; and
   a plurality of light emitting diodes mounted on each of the cutout pieces, respectively,
   wherein the cutout pieces are in contact with each other to dispose the plurality of light emitting diodes on a bent plane.

9. The lighting apparatus according to claim 8, wherein light emission center axes of the plurality of light emitting diodes are not parallel to each other with the cutout pieces in contact with each other.

10. The lighting apparatus according to claim 8, wherein the bent plane is inwardly bent.

11. The lighting apparatus according to claim 10, wherein the light emission center axes of the plurality of light emitting diodes concentrate with the cutout pieces in contact with each other.

12. The lighting apparatus according to claim 8, wherein the bent plane is a part of a spherical surface.

13. The lighting apparatus according to claim 8 further comprising a driver circuit located at the center of the flexible board for driving the plurality of light emitting diodes.

14. The lighting apparatus according to claim 13, wherein the driver circuit is radially connected to the plurality of light emitting diodes mounted on each of the cutout pieces, respectively, without cut by discontinuity between the cutout pieces.

15. A lighting apparatus for use with a plurality of light emitting diodes comprising:
   a flexible board for mounting the plurality of light emitting diodes, and
   a driver circuit located at the center of the flexible board for driving the plurality of light emitting diodes,
   wherein the driver circuit is radially connected to the plurality of light emitting diodes, respectively, without cut by a discontinuity of the flexible board between the plurality of light emitting diodes.

16. The lighting apparatus according to claim 15, wherein the flexible board includes cutout pieces radially extending from the center of the flexible board so that the cutout pieces are in contact with each other to dispose the plurality of light emitting diodes on a bent plane.

17. The lighting apparatus according to claim 16, wherein the bent plane is inwardly bent.

18. The lighting apparatus according to claim 16, wherein the light emission center axes of the plurality of light emitting diodes concentrate with the cutout pieces in contact with each other.

19. The lighting apparatus according to claim 16, wherein the bent plane is a part of a spherical surface.

* * * * *